(12) United States Patent
Chien et al.

(10) Patent No.: US 10,971,629 B2
(45) Date of Patent: Apr. 6, 2021

(54) SELF-ALIGNED UNSYMMETRICAL GATE (SAUG) FINFET AND METHODS OF FORMING THE SAME

(71) Applicants: Taiwan Semiconductor Manufacturing Company, Ltd., Hsinchu (TW); National Chiao Tung University, Hsinchu (TW)

(72) Inventors: Chao-Hsin Chien, Hsinchu (TW); Yu-Che Chou, Zhuangwei Township (TW); Chien-Wei Tsai, Baoshan Township (TW); Chin-Ya Yi, Taoyuan (TW)

(73) Assignees: Taiwan Semiconductor Manufacturing Company, Ltd., Hsinchu (TW); National Chiao Tung University, Hsinchu (TW)

( * ) Notice: Subject to any disclaimer, the term of this patent is extended or adjusted under 35 U.S.C. 154(b) by 0 days.

(21) Appl. No.: 16/374,475

(22) Filed: Apr. 3, 2019

(65) Prior Publication Data

US 2020/0006566 A1 Jan. 2, 2020

Related U.S. Application Data

(60) Provisional application No. 62/691,006, filed on Jun. 28, 2018.

(51) Int. Cl.
*H01L 29/792* (2006.01)
*H01L 29/78* (2006.01)
*H01L 21/225* (2006.01)
*H01L 29/66* (2006.01)

(52) U.S. Cl.
CPC ...... *H01L 29/7855* (2013.01); *H01L 21/2254* (2013.01); *H01L 29/66484* (2013.01); *H01L 29/66795* (2013.01); *H01L 29/66833* (2013.01); *H01L 29/7851* (2013.01); *H01L 29/792* (2013.01)

(58) Field of Classification Search
CPC ............. H01L 29/7885; H01L 21/2254; H01L 29/66484; H01L 29/66795; H01L 29/7851; H01L 29/792; H01L 29/66833
See application file for complete search history.

(56) References Cited

U.S. PATENT DOCUMENTS

| | | | |
|---|---|---|---|
| 9,263,132 B2* | 2/2016 | Tan | H01L 29/42328 |
| 2007/0210338 A1* | 9/2007 | Orlowski | H01L 29/66825 |
| | | | 257/213 |
| 2008/0230824 A1* | 9/2008 | Doornbos | H01L 29/40117 |
| | | | 257/315 |

* cited by examiner

*Primary Examiner* — Fernando L Toledo
*Assistant Examiner* — Valerie N Newton
(74) *Attorney, Agent, or Firm* — Slater Matsil, LLP

(57) ABSTRACT

Structures and methods of forming self-aligned unsymmetric gate (SAUG) FinFET are provided. The SAUG FinFET structure has two different gate structures on opposite sides of each fin: a programming gate structure and a switching gate structure. The SAUG FinFET may be used as non-volatile memory (NVM) storage element that may be electrically programmed by trapping charges in the charge trapping dielectric (e.g., $Si_3N_4$) with appropriate bias on the control gate of the programming gate structure. The stored data may be sensed by sensing the channel current through the SAUG FinFET in response to a bias on the switching gate of the switching gate structure.

20 Claims, 15 Drawing Sheets

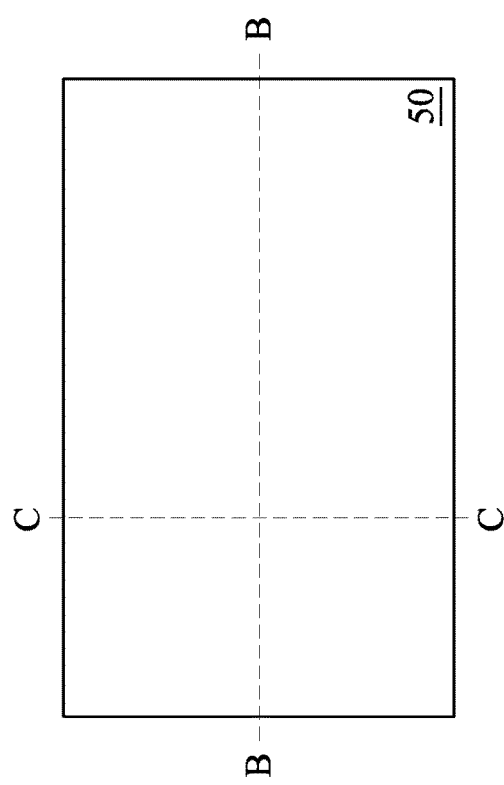
Fig. 2A
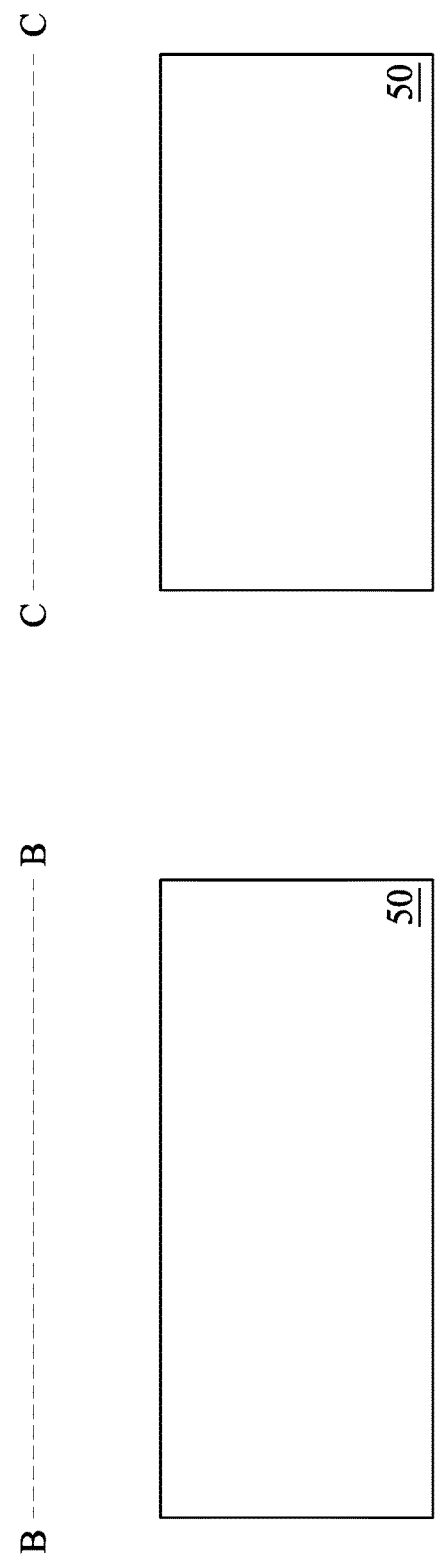
Fig. 2B
Fig. 2C

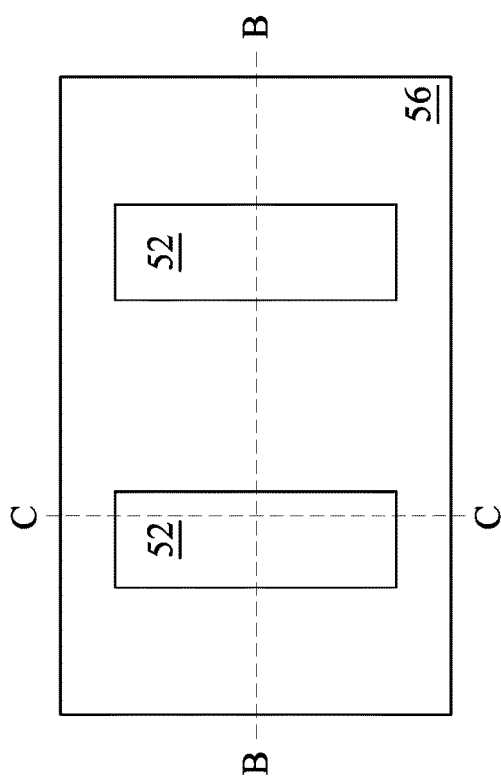
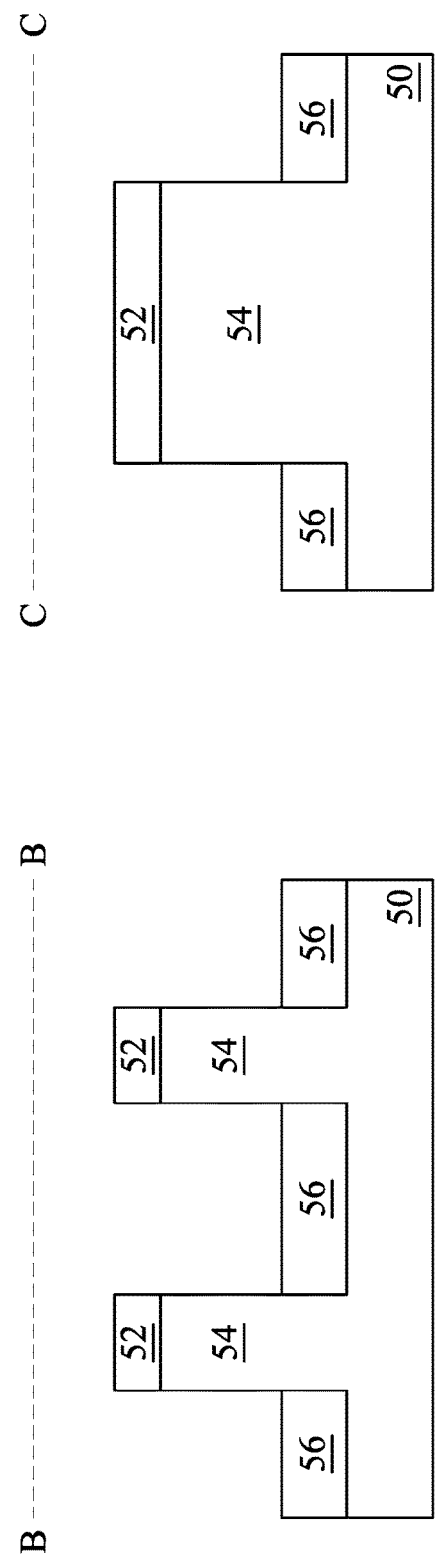
Fig. 4A
Fig. 4B
Fig. 4C

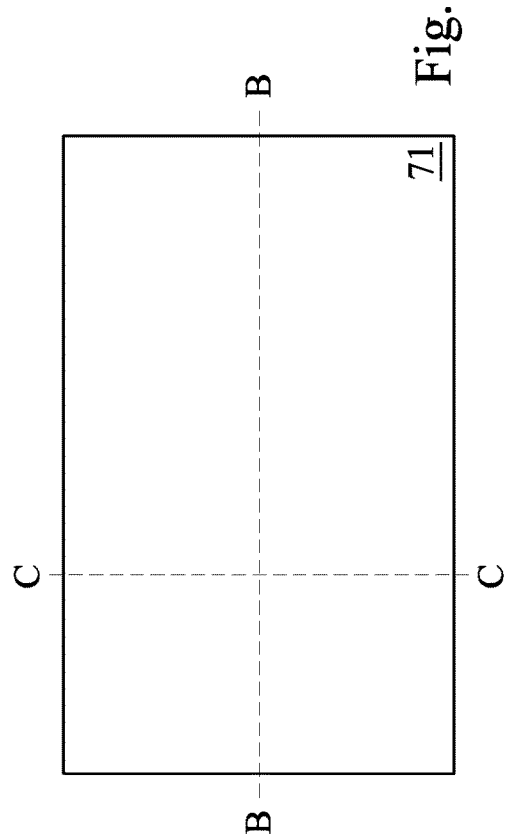
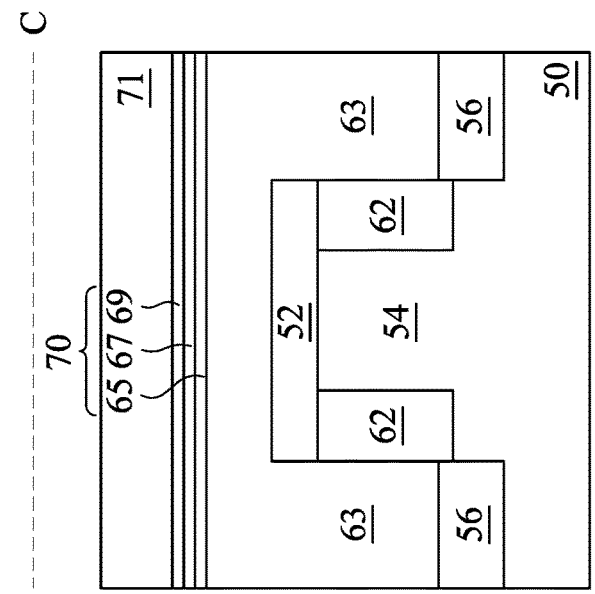
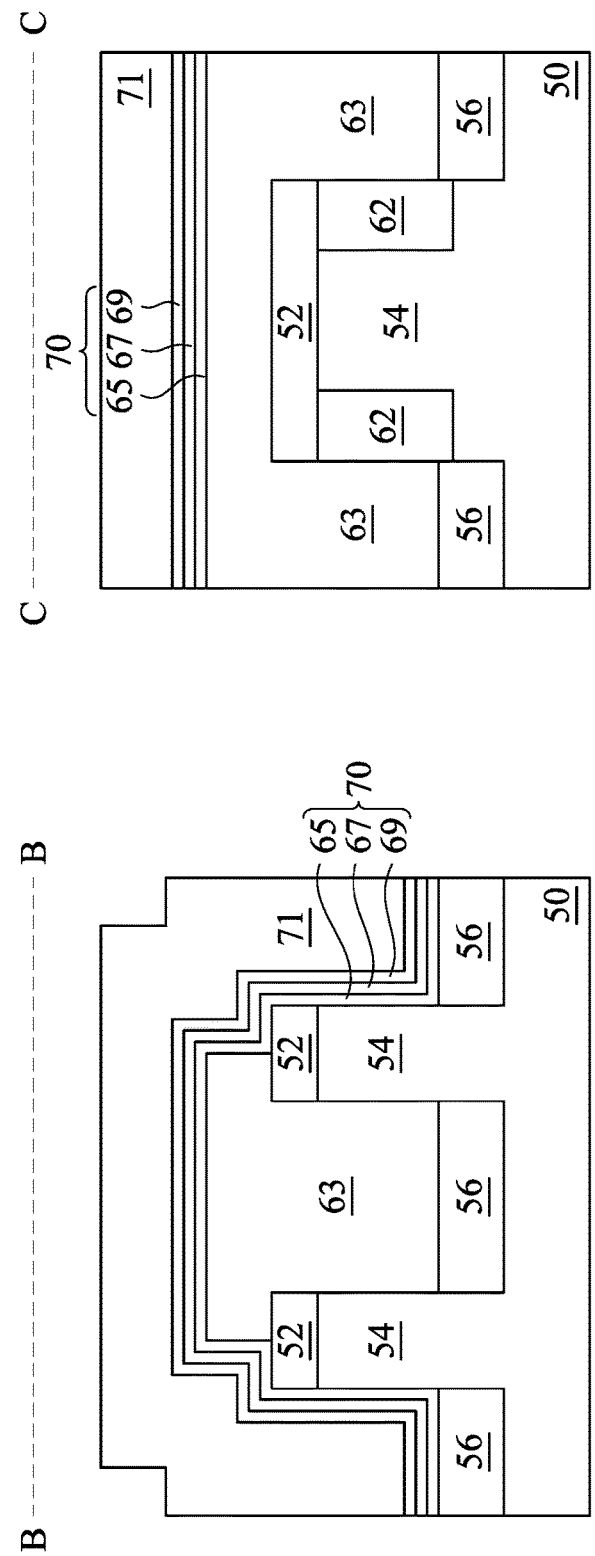

SELF-ALIGNED UNSYMMETRICAL GATE (SAUG) FINFET AND METHODS OF FORMING THE SAME

PRIORITY CLAIM AND CROSS-REFERENCE

This application claims the benefit of U.S. Provisional Patent Application No. 62/691,006, filed on Jun. 28, 2018, and entitled "Self-Aligned, Unsymmetrical Gate FinFET," which application is hereby incorporated by reference

BACKGROUND

The semiconductor industry continues to increase the density of electronic components (e.g., transistors, diodes, resistors, capacitors, etc.) in integrated circuits by progressive reductions in minimum feature size and by the use of three-dimensional (3D) transistor structures, such as a fin field-effect transistor (FinFET), which utilize the vertical dimension to deliver more drive current for the same footprint. The higher component densities enabled by innovations in semiconductor technology allow more functions to be integrated into a given area. The ability to achieve high functional density has given rise to the System-on-Chip (SoC) concept wherein multiple functional blocks such as digital logic, non-volatile memory, and analog functions are integrated on a single chip. Integrating such a diversity of functions on one chip often presents new challenges in forming and integrating a concomitantly large variety of electronic components and transistor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 15C illustrate cross-sectional and planar views of an SAUG FinFET at intermediate stages of fabrication, in accordance with some embodiments.

DETAILED DESCRIPTION

Figure 1:
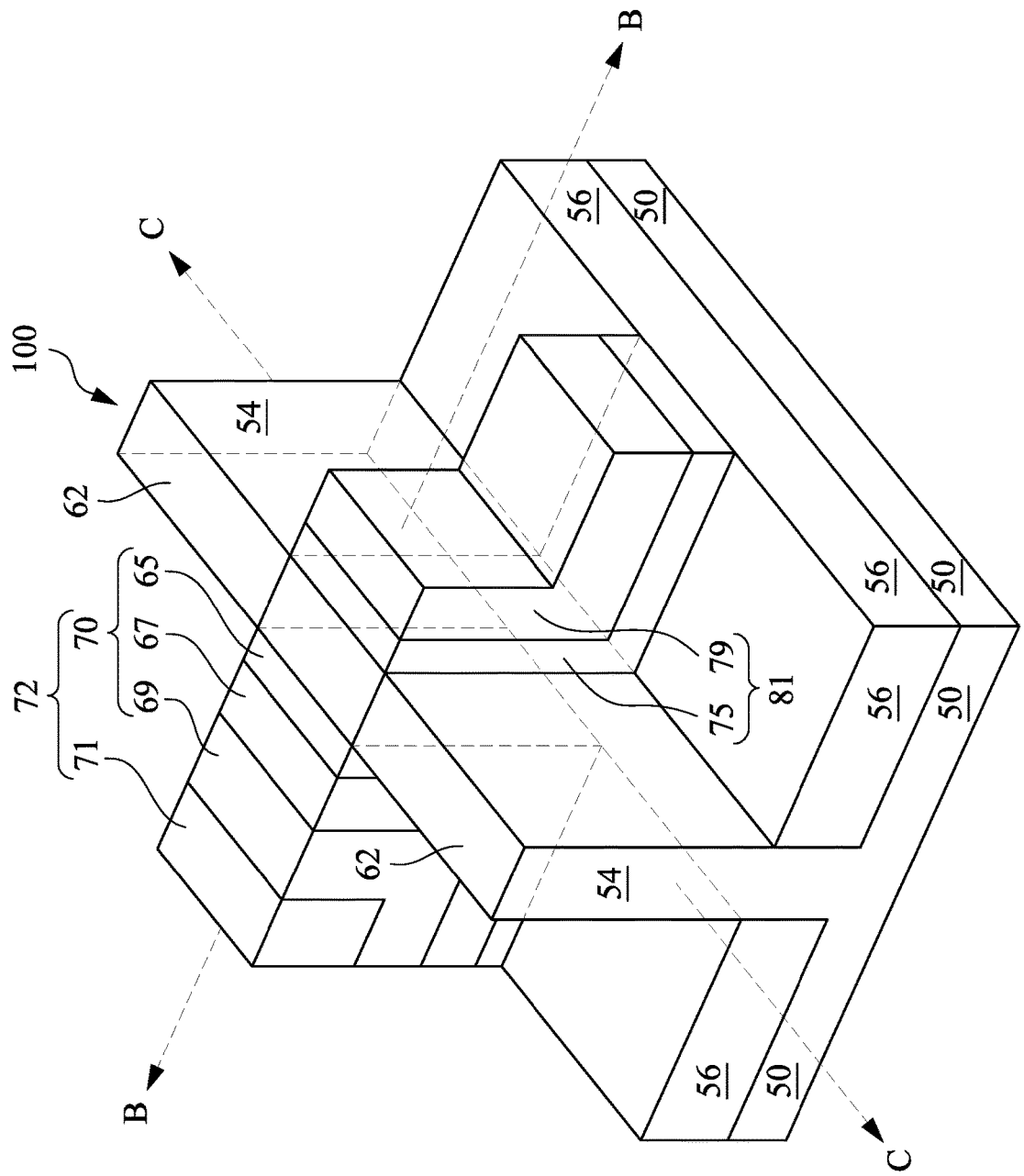
FIG. 1 illustrates a perspective view of a self-aligned, unsymmetrical gate (SAUG) FinFET in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes metal-oxide-semiconductor field-effect transistors (MOSFETs) wherein a threshold voltage ($V_T$) of each MOSFET can be programmed electrically. The transistor structures described herein are the three-dimensional MOSFETs referred to as FinFETs, where a semiconductor region that is used to form the channel and source/drain of the MOSFET is shaped like a fin protruding from a semiconductor substrate with a gate structure formed alongside the two vertical sidewalls of the fin. The programmable-$V_T$ FinFETs are unsymmetric FinFETs with two different gate structures formed on opposite sidewalls of the semiconductor fin. For example, as discussed in greater detail below, on one side of a fin there may be a programming gate structure, where the gate dielectric layers of the programming gate structure include a charge-trapping layer (e.g., a nitride layer), and on the opposing side of the fin there may be a switching gate structure similar to the gate structure of FinFETs used in digital logic and/or analog circuits. Various amounts of negative and/or positive charges may be injected into and trapped in the charge-trapping layer by appropriately biasing a gate electrode of the programming gate structure (referred to as the control gate). The charges trapped in the charge-trapping layer alter the threshold at which the FinFET may be switched from an off-state (or substantially non-conducting state) to an on-state (or conducting state) by applying a voltage, $V_G$, greater than or equal to $V_T$ on the gate of the switching gate structure. The $V_T$ may be programmed to one of several values by forcing the device into one of several charged states by applying a respective programming voltage on the control gate. Since the drain-to-source current ($I_{DS}$) of a MOSFET depends on the $V_T$, the programmed state can be read by sensing the magnitude of electrical current flowing through the transistor when it is biased on.

In some embodiments, the transistor is designed such that leakage of trapped charges may be negligible, irrespective of the normal operating power supply being connected, so that each charged state may be considered to be metastable. Accordingly, after a device is programmed into its respective charged state, it may remain in that state, during which time multiple read operations may be performed. Also, the device may be cycled multiple times between different charged states with insignificant loss in the stability and readability of its multiple metastable charged states. Accordingly, the embodiments described in this disclosure may be used as electrically erasable and programmable non-volatile memory (NVM) storage elements. In some embodiments, the programmable $V_T$ devices include a self-aligned, unsymmetrical gate (SAUG) FinFET structure, described in greater detail below.

FIG. 1 illustrates an example of an SAUG FinFET device 100 that may be programmed to multiple charged states, each corresponding to a respective $V_T$, in accordance with some embodiments. The SAUG FinFET device 100 comprises a fin 54 on a substrate 50 (e.g., a semiconductor substrate). Isolation regions 56 are disposed on the substrate 50, and the fin 54 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 54 is illustrated as a single, continuous material as the substrate 50, the fin 54 and/or the substrate 50 may comprise a single material or a plurality of materials. In this context, the fin 54 refers to the portion extending between and above the neighboring isolation regions 56.

As illustrated in FIG. 1, the SAUG FinFET device 100 is a dual-gate FinFET device having two different gate structures: a programming gate structure 72 and a switching gate structure 81 on opposing sidewalls of the upper portion of the fin 54. Source/drain regions 62 are disposed in the fin 54 on opposing sides of the programming gate structure 72 and the switching gate structure 81, and a channel region disposed in between the source/drain regions 62.

The programming gate structure 72 comprises a structure capable of trapping programming charges, thereby affecting the $V_T$ of the switching gate structure 81. In some embodiments, the semiconductor channel and the programming gate structure 72 collectively comprise a semiconductor-oxide-nitride-oxide-semiconductor (SONOS) structure. For example, the SAUG FinFET device 100 illustrated in FIG. 1 includes a programming structure comprising the upper portion of the fin 54 (e.g., a semiconductor material) and the programming gate structure 72. The programming gate structure 72, formed adjacent to the fin 54, comprises a programming gate dielectric layer 70 and a control gate 71 (e.g., a semiconductor material) formed over the programming gate dielectric layer 70. In some embodiments, the programming gate dielectric layer 70 comprises a first dielectric layer 65, a second dielectric layer 67, and a third dielectric layer 69. The first dielectric layer 65 of programming gate dielectric layer 70, referred to as the tunnel dielectric 65, comprises an insulator (e.g., an oxide) which may be sufficiently thin to allow charge transport through of the dielectric by electron tunneling. The second dielectric layer 67 of gate dielectric layer 70, referred to as the charge trapping dielectric 67, may comprise an insulating material (e.g., a nitride) with a high density of localized electronic states in which charge may be trapped. The third dielectric layer 69 referred to as the barrier dielectric 69, may comprise an insulating material (e.g., an oxide) serves as a barrier which prevents trapped charge from leaking out of the charge trapping dielectric 67 to the control gate 71. In order to suppress the charge leakage, the barrier dielectric 69 may be formed thicker than the tunnel dielectric 65.

An appropriate programming voltage may be applied to the control gate 71 to program the SAUG FinFET 100 to its respective charged state. Electric charges may be transported between the fin 54 and the charge trapping dielectric 67 via the tunnel dielectric 65 during programming. The net charge in the charge trapping dielectric 67 determines the charged state of the SAUG FinFET 100. The barrier dielectric 69 capacitively couples a portion of the programming voltage to drop across the tunnel dielectric 65 to induce the requisite charge transport through the tunnel dielectric 65 to program the device to a desired charged state. For the charged states to function as non-volatile storage elements, the charge trapped in the charge trapping dielectric 67 during programming may be retained for a long time, typically several years or longer.

The switching gate structure 81 of the SAUG FinFET structure 100, illustrated in FIG. 1, may be a switching gate layer 79 over a switching gate dielectric layer 75. The switching gate structure 81 may be used to allow current to flow between the source/drain regions 62, the $V_T$ of which is controlled by the trapped charge in the programming gate structure 72. Separate electrical connections (not shown) may be made to the control gate 71 and the switching gate layer 79 so that the two gates may be biased independently to allow for programming and switching capabilities.

Both the programming gate structure 72 and the switching gate structure 81 are adjacent the same upper portion of the fin 54. This coupling allows the charged state of the SAUG FinFET device 100 to be set by programming $V_T$ using the control gate 71 of the programming gate structure 72 (e.g., SONOS structure) and subsequently sensed by reading the channel current induced by turning on the switching gate layer 79.

The illustration in FIG. 1 omits several detailed features (e.g., contacts to the gates and source/drain regions) of the SAUG FinFET device 100 for the sake of clarity in depicting the unsymmetric, dual-gate aspect of the structure. A more complete description of forming the SAUG FinFET device 100 using suitable processing techniques and materials is given below with reference to FIGS. 2A through 15C. FIG. 1 further illustrates reference cross-sections that are referred to in later figures. Cross-section B-B is along a longitudinal axis of the programming gate structure 72 and switching gate structure 81, and in a direction of, for example, perpendicular to a current flow between the source/drain regions 62. Cross-section C-C is perpendicular to cross-section B-B and extends along a longitudinal axis of fin 54 of the SAUG FinFET 100 and in a direction of, for example, parallel to a current flow between the source/drain regions 62. Note that the cross-sectional image of the structure along the longitudinal axis C-C of the fin 54 depends on whether C-C is closer to the programming gate structure 72 or closer to the switching gate structure 81 on the opposite side. In this disclosure, the axis C-C has been arbitrarily chosen to be closer to the switching gate structure 81. Subsequent figures refer to these reference cross-sections for illustrative purposes.

FIGS. 2A through 15C depict cross-sectional and planar views of the SAUG FinFET device 100 at intermediate stages in the fabrication process, in accordance with some embodiments. Although FIG. 1 illustrates a single fin and associated gate structures, it is understood that an SAUG FinFET device may comprise multiple fins and respective gate structures. Accordingly, the illustrations in FIGS. 2A through 15C depict the intermediate stages of an SAUG FinFET structure comprising a combination of two fins 54 and their respective programming gate structures 72 and the switching gate structures 81. Each of the intermediate stages of the fabrication process shown in FIGS. 2A through 15C is illustrated by a set of three views. Figures ending with an "A" designation illustrate a top-down view or planar view of the structure, figures ending with a "B" designation correspond to a cross-sectional view along reference cross-section B-B illustrated in FIG. 1, and figures ending with a "C" designation correspond to a cross-sectional view along reference cross-section C-C illustrated in FIG. 1.

In FIGS. 2A-2C a substrate 50 is provided. The substrate 50 may be a semiconductor substrate, such as a bulk semiconductor, or a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically silicon or glass substrate. Other substrates, such as multi-layered substrates, gradient substrates, or hybrid orientation substrates may also be used. In some embodiments, the semiconductor material of the substrate 50 may include an elemental semiconductor including Si, or Ge, or the like; or their alloys (e.g., $Si_xGe_{1-x}$); a compound semiconductor including SiC, GaAs, InAs, AlAs, GaP, InP, GaN, InSb, CdTe, ZnO, ZnSe, and the like; and their alloys (e.g., $Ga_xAs_{1-x}P$, $Al_xIn_{1-x}As$, $Al_xGa_{1-x}As$, $Ga_xIn_{1-x}As$, $Ga_xIn_{1-x}P$, $Ga_yIn_{1-y}As_xP_{1-x}$, and/or the like); or combinations thereof. Both NMOS FinFETs and PMOS FinFETs may be formed in different portions of the substrate 50. Generally, NMOSFETs are formed in a lightly doped p-type portion of a semiconductor substrate, (e.g., lightly doped p-type bulk crystalline Si) and PMOSFETs are formed in a lightly doped n-type portion of a semiconductor substrate, (e.g., lightly doped p-type bulk crystalline Si selectively counter-doped to form one or more n-type regions).

Figure 3C:
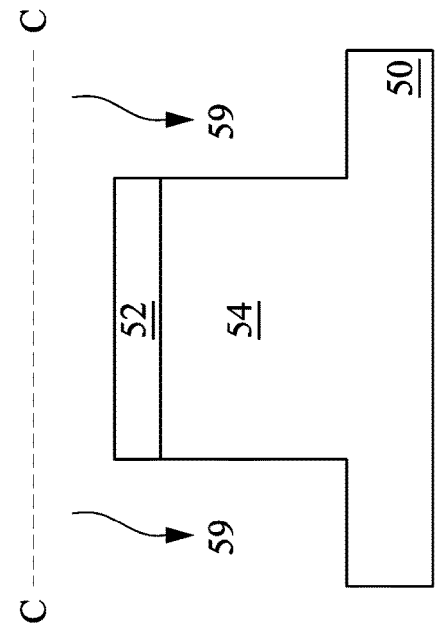
Figure 3A:
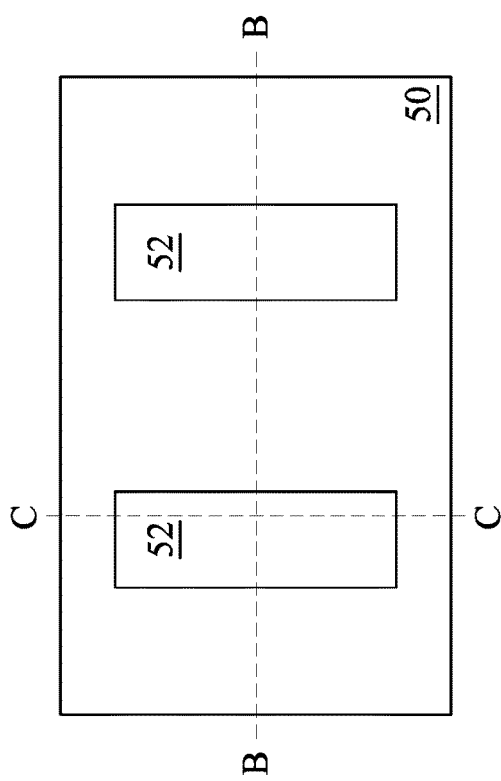
Figure 3B:
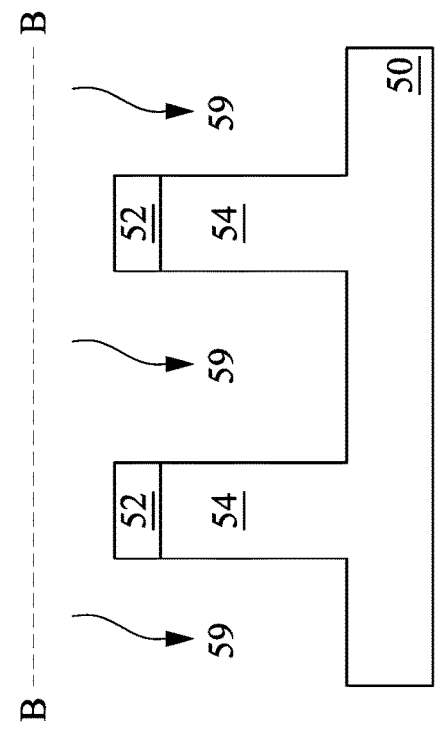

Referring to FIGS. 3A-3C, substrate 50 may be patterned to form protruding fin-shaped semiconductor strips, or fins 54, by etching trenches 59 in substrate 50 using any suitable patterning method. In some embodiments, a hard mask layer 52 may be formed over the substrate 50, and used as a masking layer to etch exposed portions of the substrate 50 to form the trenches 59 in the substrate 50, leaving semiconductor fins 54 protruding from a substrate 50, as illustrated in FIGS. 3B and 3C. The trenches 59 comprise the space between and surrounding adjacent fins 54, a top surface of the semiconductor fins being covered by the hard mask layer 52. The respective plan view in FIG. 3A illustrates the hard mask layer 52 and a portion of the substrate 50 which is exposed at the bottom of trenches 59. In some embodiments, the fins 54 may be formed closely spaced and with one longitudinal dimension much larger than the other, such that in a plan view the trenches 59 appear as closely spaced strips running parallel to each other.

The hard mask layer 52 may comprise one or more dielectric layers (e.g., a silicon oxide layer dispositioned below a silicon nitride layer) and, in some embodiments, may be used as a stopping layer in subsequent planarization and etching steps. In some embodiments, the hard mask layer 52 may be formed using a direct patterning technique wherein the dielectric layers of the hard mask layer 52 are deposited successively adjacent to the top surface of the substrate 50 and etched with a patterned photoresist mask (not shown) formed using appropriate photolithography techniques.

In some embodiments, a patterning technique referred to as sidewall image transfer (SIT), may be utilized. SIT is a self-aligned double patterning (SADP) technique that combines photolithography and self-aligned processes, allowing patterns to be created that have, for example, pitches smaller than what is otherwise obtainable using a single patterning technique. In the SIT technique, a sacrificial layer (not shown in FIGS. 3A-3C) is formed over the substrate 50 and patterned using suitable photolithography and etching techniques to form mandrels. Next, the dielectric layers of the hard mask layer 52 are deposited successively over the mandrels. An anisotropic etching technique, (e.g., reactive ion etching (RIE)) is used to form self-aligned spacers alongside the mandrels. The mandrels are then removed, leaving the spacers (e.g., remaining portions of the hard mask layer 52) over the substrate 50.

FIGS. 4A-4C illustrate shallow trench isolation (STI) regions 56 formed over the substrate 50 and in the region between neighboring semiconductor fins 54, collectively referred to as the isolation region 56. In some embodiments, the STI regions 56 may be formed by depositing an insulation material (not shown) and patterning the insulation material as illustrated in FIGS. 4A-4C. For example, the insulating material may be formed over the substrate 50 and filling the space in between neighboring fins 54. In some embodiments, a liner (not shown), for example a thermally grown silicon oxide layer, may be formed alongside the exposed semiconductor surfaces of fins 54 and substrate 50 prior to further deposition of the insulation material to fill the trenches 59 (shown in FIGS. 3A-3C). The insulation material may be an oxide, such as silicon oxide, and may be formed by a chemical vapor deposition (CVD), a low-pressure CVD (LPCVD), an atmospheric pressure CVD (APCVD), rapid thermal CVD (RTCVD), a plasma-enhanced CVD (PECVD), a high density plasma CVD (HDP-CVD), a remote plasma CVD (RPCVD), a flowable CVD (FCVD) (e.g., a CVD-based flowable material deposited using a remote plasma system and subsequently cured to convert it to another material, such as an oxide), the like, or a combination thereof. Other insulation materials (e.g., a nitride) and/or other formation processes may be used. An anneal process may be performed after the insulation material is formed.

The insulation layer is recessed to form the isolation regions 56 over the substrate 50 and surrounding the fins 54, as illustrated in FIGS. 4A-4C. A two-step etching technique may be applied wherein first, a planarization process (e.g., chemical mechanical polish (CMP)) may be used to remove the insulation material from over the fins 54 to form a top surface substantially coplanar with the hard mask layer 52, which also serves as an etch stop layer for the planarization process. In the second step of the etch process, suitable etchants may be used to further selectively remove insulation material to form the recessed STI region 56 as illustrated in FIGS. 4B and 4C. In some embodiments, the second step of the etch process may be a wet etch process (e.g., using dilute hydrofluoric acid), or a dry etch process (e.g., plasma etch using $CF_4$ chemistry), or a combination thereof.

The dimensions of the portion of the semiconductor fin 54 protruding above the isolation regions 56, as seen in the cross-sectional view in FIG. 4B, may influence the electrical characteristics of the SAUG FinFET 100 (see FIG. 1). For example, the electrical width of the SAUG FinFET 100 increases with increasing height of the protrusion above the isolation regions 56. For the SAUG FinFET 100, the width of the protrusion, referred to as the fin-width of fin 54, influences the electrical coupling between the trapped charge in the programming gate structure 72 (see FIG. 1) of the SAUG FinFET 100 and the respective $V_T$. Decreasing the fin-width of fin 54 may increase the magnitude of the change in $V_T$ with respect to a change in the trapped charge caused by applying a programming voltage to the control gate. In some embodiments, where the programming voltages applied between the control gate and the source of the SAUG FinFET 100 are from about negative 10 volts to about positive 10 volts, the fin-width of fin 54 may be from about 10 nm to about 14 nm.

FIGS. 2A through 4C illustrate embodiments of methods that include etching trenches in the semiconductor substrate 50 to form the fins 54. Other embodiments may use methods that include depositing semiconductor material to form the fins 54 above the semiconductor substrate 50. For example, a dielectric layer may be formed over the substrate 50; trenches may be patterned in the dielectric layer to expose strips of the surface of substrate 50; semiconductor material may be selectively deposited over the exposed strips of the substrate 50 using, for example, selective epitaxial growth (SEG); the dielectric layer may then be recessed such that a portion of the epitaxial structures protrude from the dielectric layer. The semiconductor material grown by SEG over the substrate 50 may form the fins 54, and the recessed dielectric layer may form the isolation regions 56.

Figure 5A:
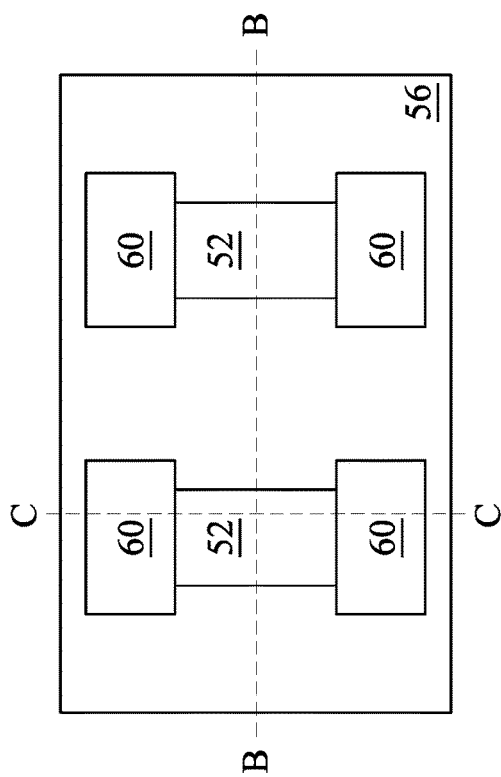
Figure 5C:
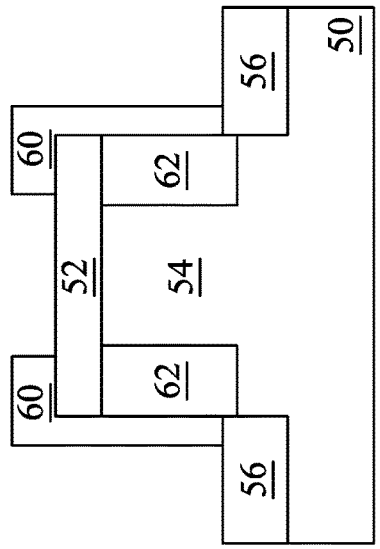
Figure 5B:
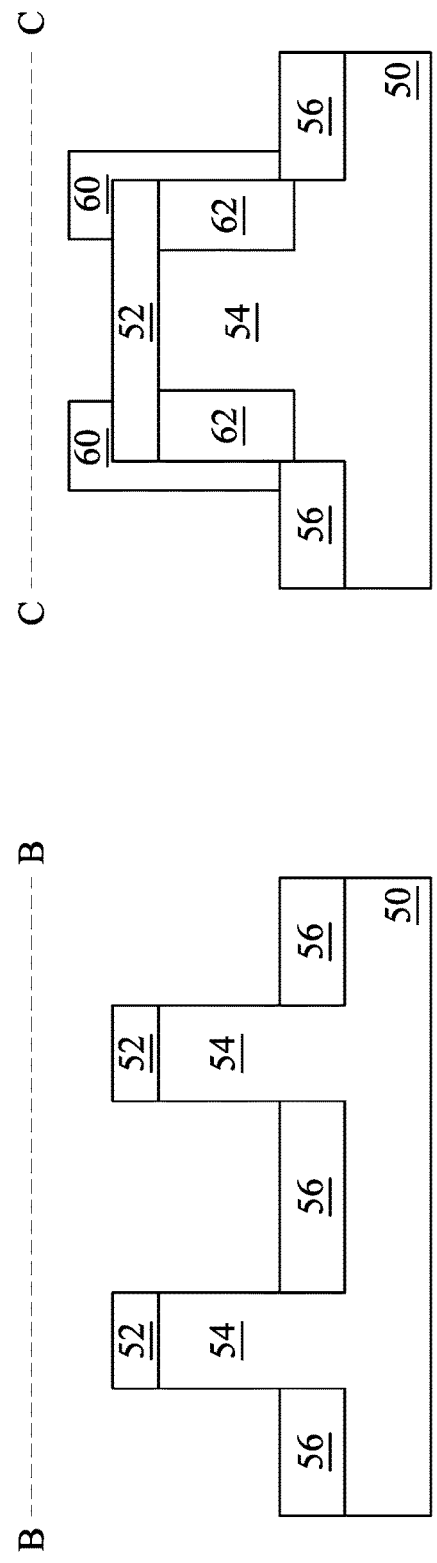

FIGS. 5A-5C illustrate formation of the source/drain regions 62 using a solid-source diffusion technique. The source/drain regions 62 are doped regions in the upper portions of the fins 54, as illustrated in FIG. 5C. The source/drain regions 62 are generally more heavily doped with the opposite type of dopants relative to the type used to dope the fins 54. For example, in an NMOS SAUG FinFET, the fin 54 is lightly doped with p-type dopants (e.g., B or In in Si) while the source/drain regions 62 are heavily doped with n-type dopants (e.g., As or P in Si). The location of the resulting two pn junctions (the edges of the two source/drain regions 62 in FIG. 5C) outlines the channel region in the fin 54.

In some embodiments, appropriate patterning techniques may be used to form a patterned sacrificial doping layer 60 alongside a portion of the sidewalls of the upper portion of the fin 54. As illustrated in FIGS. 5A-5C, the patterned sacrificial doping layer 60 covers the sidewalls and an upper surface of the fins 54 in the desired source/drain regions 62. A high temperature anneal, referred to as the drive-in anneal, may be performed to out-diffuse dopant atoms from the patterned sacrificial doping layer 60 into the upper portion of the fin 54. In some embodiments, the dopant may diffuse laterally into the fin 54 toward the space between the two regions of the patterned sacrificial doping layer 60. The thermal budget for the drive-in anneal determines the distance the dopants diffuse from the edge of the patterned sacrificial doping layer 60 to the location of the pn junction defining the edge of the source/drain regions 62. The temperature and time for the drive-in anneal may be selected such that the edge of the source/drain regions 62 inside the fin 54 reaches a desired location for a selected design. In some embodiments, the drive-in anneal may be done at a temperature of about 450° C. to about 550° C. for a time of about 25 minutes to about 35 minutes.

In some embodiments, phosphosilicate glass (PSG) may be used as a source for P to form source/drain regions of an NMOS SAUG FinFET, and in an embodiment where a PMOS SAUG FinFET is formed, borosilicate glass (BSG) may be used as a source for B. Other solid sources such as doped spin-on glasses may also be used. The patterned sacrificial doping layer 60 may be selectively removed after the drive-in anneal using, for example, a wet etch process in which the removal rate of doped glass is high relative to the dielectrics used to form the exposed regions of the isolation regions 56, the hard mask layer 52, and the semiconductor material in exposed regions of the fins 54.

The embodiments illustrated by FIGS. 5A-5C use the solid-source diffusion technique to introduce dopants into semiconductor fins, but it is understood that other methods such as, ion implantation, or gaseous source diffusion, or in situ doped SEG, with appropriate patterned masking layers (e.g., a photoresist mask, or a sacrificial hard mask) may also be used to introduce dopants to form the source/drain regions of the SAUG FinFET.

Figure 6A:
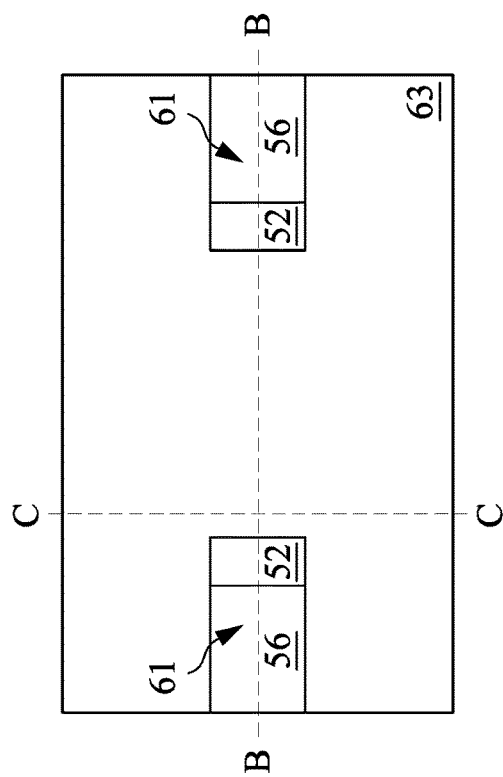
Figure 6B:
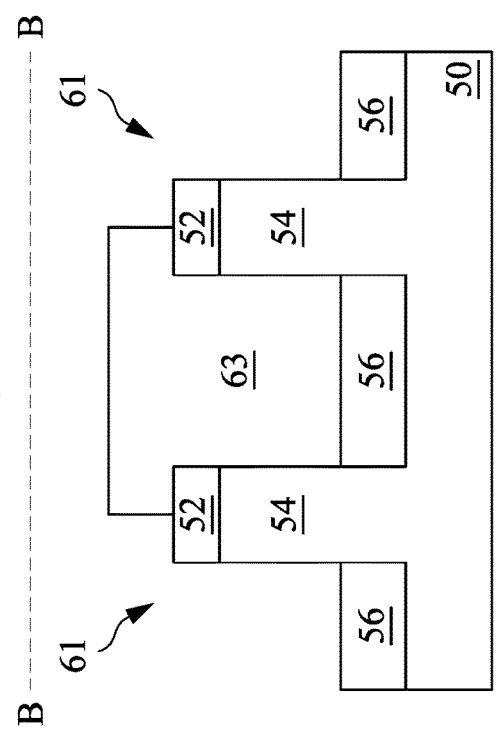
Figure 6C:
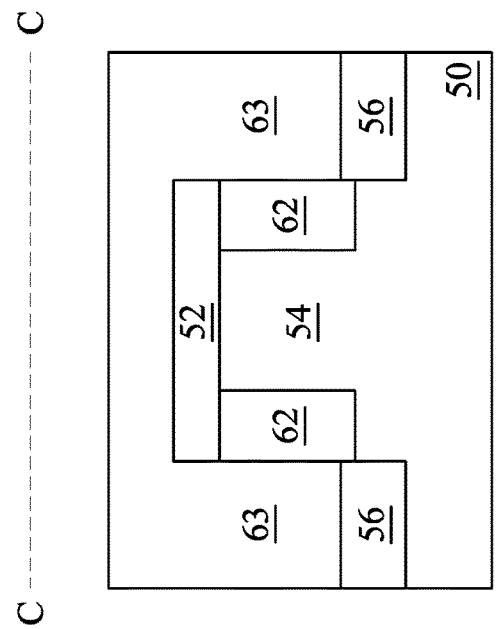

The processing steps that may be used to form, for example, the programming gate structure 72 in FIG. 1, are described below with reference to FIGS. 6A through 8C. Referring first to FIGS. 6A-6C, a patterned sacrificial layer 63 is formed by depositing a dielectric layer (e.g., silicon oxide) over the surface to fill the gaps between adjacent fins 54. As illustrated in FIGS. 6A and 6B, portions of the patterned sacrificial layer 63 may then be removed selectively using photolithography techniques to pattern openings 61 in which the programming gate structures 72 may be subsequently formed. In some embodiments, the surface of the sacrificial layer 63 may be planarized (e.g. by CMP) prior to patterning the sacrificial layer 63. A mask (e.g., a patterned photoresist mask) may be used to etch the openings 61 in the sacrificial layer 63, thereby exposing a surface comprising portions of the hard mask layer 52, portions of the isolation regions 56, and a portion of one sidewall of upper portion the fins 54 corresponding to the desired channel region. The material used to form the sacrificial layer 63 may be selected such that an appropriate wet etch or dry etch process may be used wherein the etch rate of the material of the sacrificial layer 63 is sufficiently high relative to the etch rates of the dielectrics used to form the isolation regions 56, the hard mask layer 52, and the semiconductor material of the fins 54. In some embodiments, the sacrificial layer 63 comprises a low-density silicon oxide (e.g., aerogels, or porous oxide, or the like) and the dielectric used to form isolation regions 56 comprises a dense silicon oxide (e.g., silicon oxide formed using an HDP-CVD deposition technique). In some embodiments, the sacrificial layer 63 comprises a doped silicon oxide (e.g., PSG, or BSG, or borophosphosilcate glass (BPSG), or the like).

Referring now to FIGS. 7A-7C, layers of the programming gate structure 72 (see FIG. 1) are formed in accordance with some embodiments. For example, in embodiments in which the programming gate structure 72 comprises a SONOS structure as described above with reference to FIG. 1, the tunnel dielectric 65, the charge trapping dielectric 67, the barrier dielectric 69, and the control gate 71 are successively deposited over the surface after the patterned sacrificial layer 63 is formed. The tunnel dielectric 65 and the barrier dielectric 69 may comprise $SiO_2$, or a high-k dielectric material such as, a metal oxide or a silicate of Hf, Al, Zr, La, Mg, Ba, Ti, Pb, and combinations thereof. The charge trapping dielectric 67 may be a dielectric with a band gap smaller than the tunnel dielectric 65 and the barrier dielectric 69. For example, the charge trapping dielectric 67 may be $Si_3N_4$ if the tunnel dielectric 65 and barrier dielectric 69 are $SiO_2$. The charge trapping dielectric 67 may also be a small-bandgap high-k dielectric (e.g., $HfO_2$) positioned between the tunnel dielectric 65 and the barrier dielectric 69 formed using large-bandgap high-k dielectrics (e.g., $Al_2O_3$). The conductive materials used to form the control gate may be utilized for work function tuning. The control gate 71 may comprise heavily doped, polycrystalline silicon, or a metal such as TiN, TaN, TaC, Co, Ru, Al, combinations thereof, or multi-layers thereof. The tunnel dielectric 65, the charge trapping dielectric 67, the barrier dielectric 69, and the control gate 71 may be deposited using any suitable technique such as, CVD, LPCVD, RTCVD, HDP-CVD, RPCVD, physical vapor deposition (PVD), atomic layer deposition (ALD), plasma-enhanced ALD (PEALD), or the like. The tunnel dielectric 65 may also comprise $SiO_2$ grown by thermal oxidation of Si in embodiments where the upper portion of fin 54 comprises Si. In embodiments where the control gate 71 includes a metal layer, an electrochemical plating (ECP), or an electroless plating technique may also be used to deposit the metallic materials. In some embodiments, the tunnel dielectric 65 comprises $SiO_2$ of about 4.5 nm thick to about 5.5 nm thick, the charge trapping dielectric 67 comprises $Si_3N_4$ of about 11 nm thick to about 13 nm thick, the barrier dielectric 69 comprises $SiO_2$ of about 8 nm thick to about 10 nm thick, and the control gate 71 comprises n-type polycrystalline silicon of about 20 nm thick to about 40 nm thick. In an example embodiment, the upper portion of the fin 54 may be crystalline Si, the tunnel dielectric 65 may be a 4.7 nm $SiO_2$ layer, the charge trapping layer 67 may be a 12 nm $Si_3N_4$ layer, the barrier dielectric layer 69 may be a 9.4 nm $SiO_2$ layer, and the control gate 71 may be a heavily-doped, n-type polycrystalline silicon layer (for an NMOS SAUG FinFET 100) or a heavily-doped, p-type polycrystalline silicon layer (for a PMOS SAUG FinFET 100).

Figure 8C:
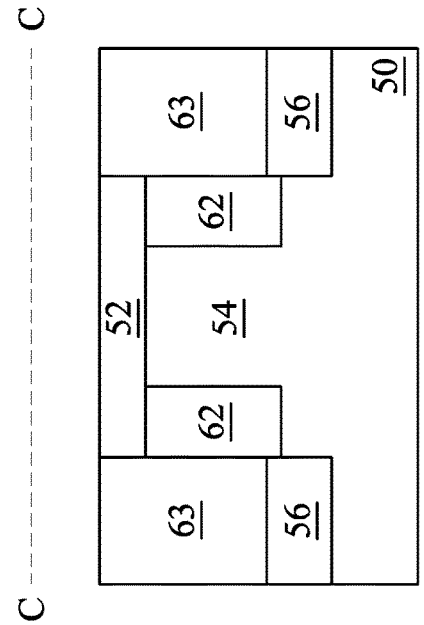
Figure 8A:
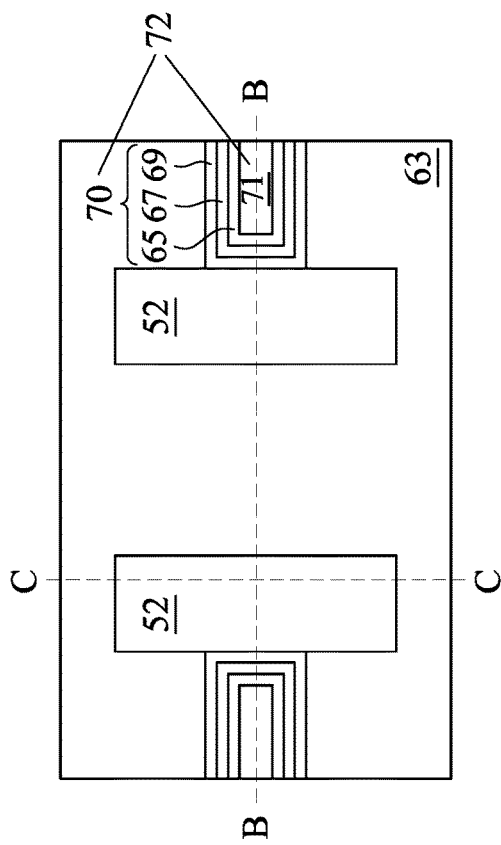
Figure 8B:
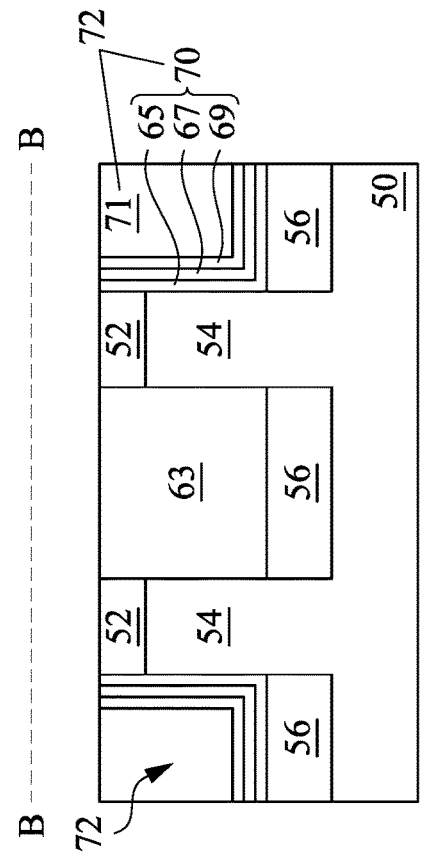

In FIGS. 8A-8C the patterned sacrificial layer 63, the tunnel dielectric 65, the charge trapping layer 67, the barrier dielectric 69, and the control gate layer 71 are etched back using a planarization process (e.g., a CMP planarization process) to remove excess material extending above the hard mask layer 52, wherein the hard mask layer 52 acts as an etch stop for the planarization process. After the planarization process, top surfaces of the hard mask layer 52, the patterned sacrificial layer 63, the tunnel dielectric 65, the charge trapping layer 67, the barrier dielectric 69, and the control gate 71 are formed substantially coplanar with each other within process variations. As illustrated in FIGS. 8A and 8B, the planarization process inlays the programming gate structure 72 in the patterned sacrificial layer 63. The sidewall of the programming gate structure 72 which is adjacent to the sidewall of the upper portion of the fin 54 is formed self-aligned to, and in physical contact with the sidewall of the respective upper portion of the fin 54.

Figure 9C:
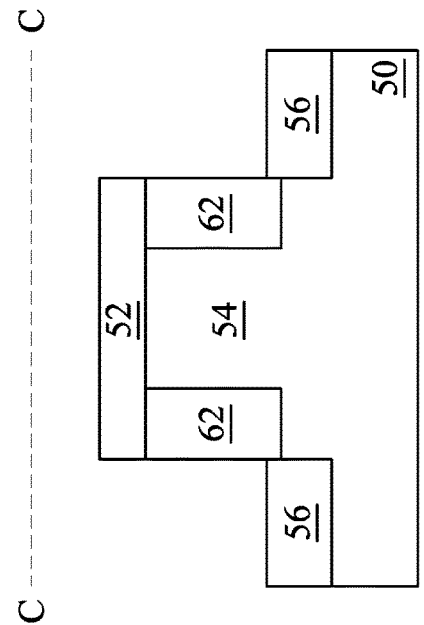
Figure 9A:
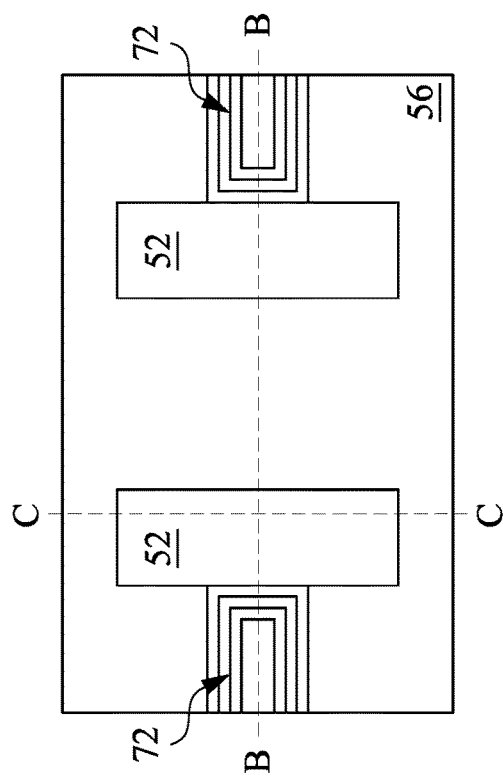
Figure 9B:
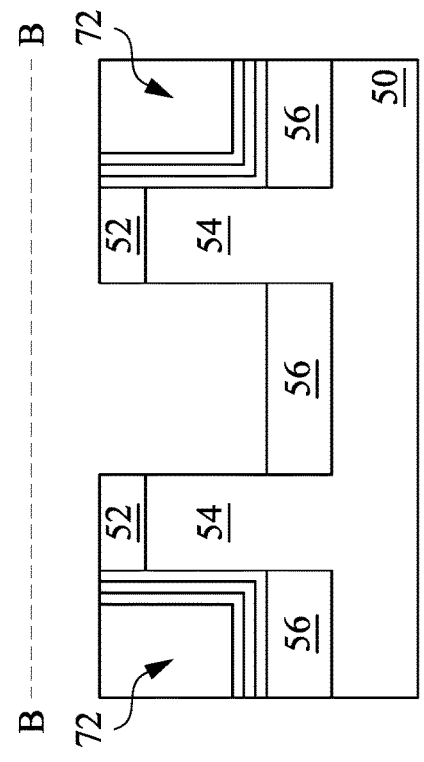

FIGS. 9A-13C illustrate various intermediate steps that may be used to form the switching gate structure 81 (see FIG. 1) in accordance with some embodiments. Referring first to FIGS. 9A-9C, the patterned sacrificial layer 63 is removed using an appropriate wet etch or dry etch process wherein the etch rate of the dielectric material of the patterned sacrificial layer 63 is sufficiently selective relative to the etch rates of the dielectrics used to form the isolation regions 56, hard mask layer 52, and the semiconductor material of the fins 54, as well as the materials of the programming gate structure 72.

Figure 10C:
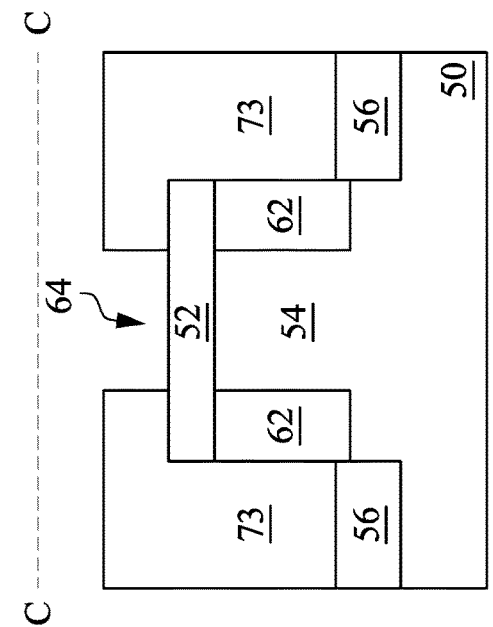
Figure 10A:
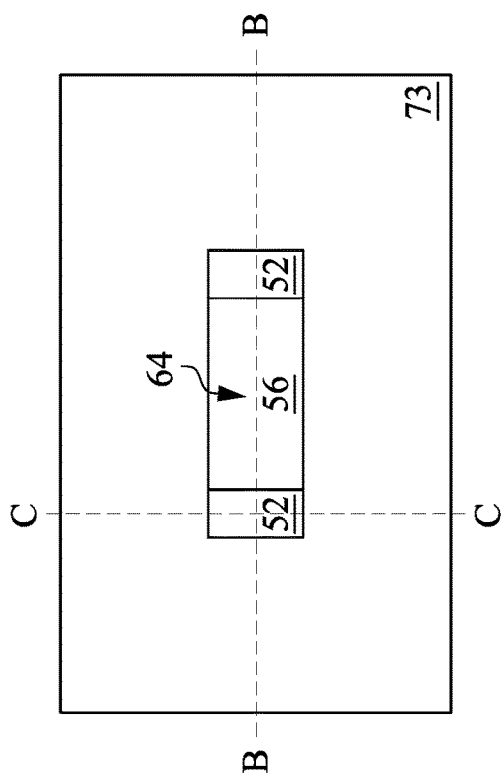
Figure 10B:
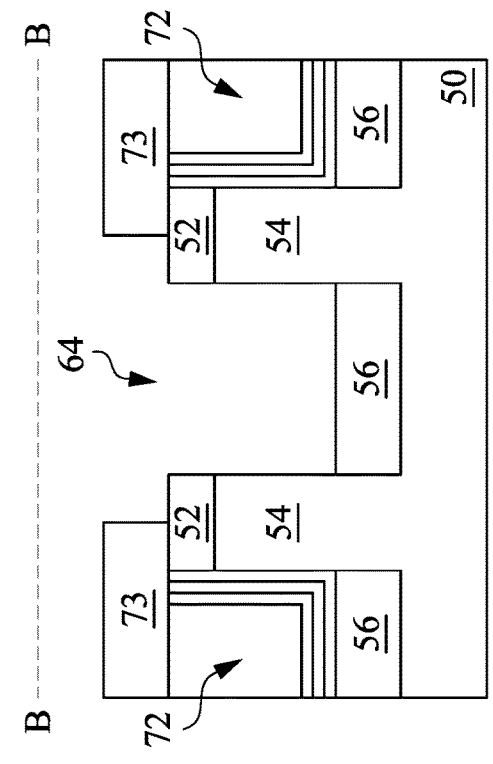

In FIGS. 10A-10C a patterned dielectric layer 73 is formed by depositing and patterning a dielectric material (e.g., silicon oxide) to fill the gaps between adjacent upper portions of fins 54. The dielectric material may be patterned by using photolithography techniques to pattern openings 64 in which the switching gate structures 81 (see FIG. 1) may be subsequently formed. In some embodiments, the surface of the patterned dielectric layer 73 may be planarized (e.g. by CMP) prior to patterning the patterned dielectric layer 73. A mask (e.g., a patterned photoresist mask) may be used to etch the openings 64 in the patterned dielectric layer 73, thereby exposing portions of the hard mask layer 52, portions of the isolation regions 56, and portions of the fins 54 located directly opposite to the programming gate structure 72. The dielectric material used to form the patterned dielectric layer 73 may be selected such that an appropriate wet etch or dry etch process may be used wherein the etch rate of the dielectric material of the patterned dielectric layer 73 is sufficiently high relative to the etch rates of the dielectrics used to form the isolation regions 56, the hard mask layer 52, and the semiconductor material of the fins 54. In some embodiments, the patterned dielectric layer 73 comprises a low-density silicon oxide (e.g., aerogels, or porous oxide, or the like) and the dielectric used to form isolation regions 56 comprises a comparatively dense silicon oxide (e.g., silicon oxide formed using an HDP-CVD deposition technique). In some embodiments, the patterned dielectric layer 73 comprises a doped silicon oxide (e.g., PSG, or BSG, or BPSG, or the like).

Figure 11C:
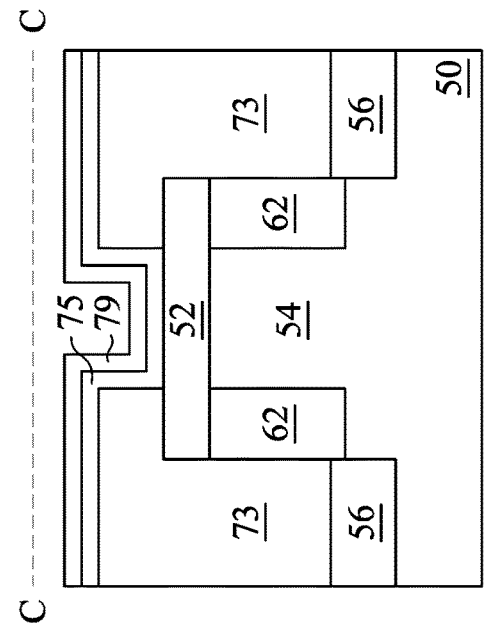
Figure 11A:
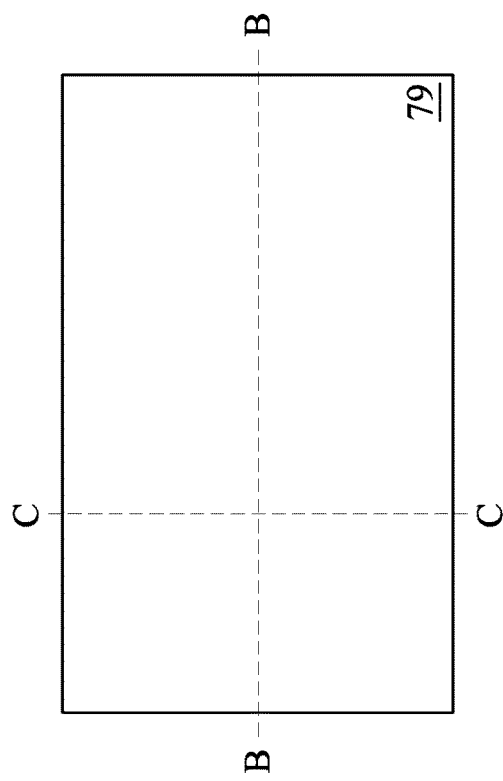
Figure 11B:
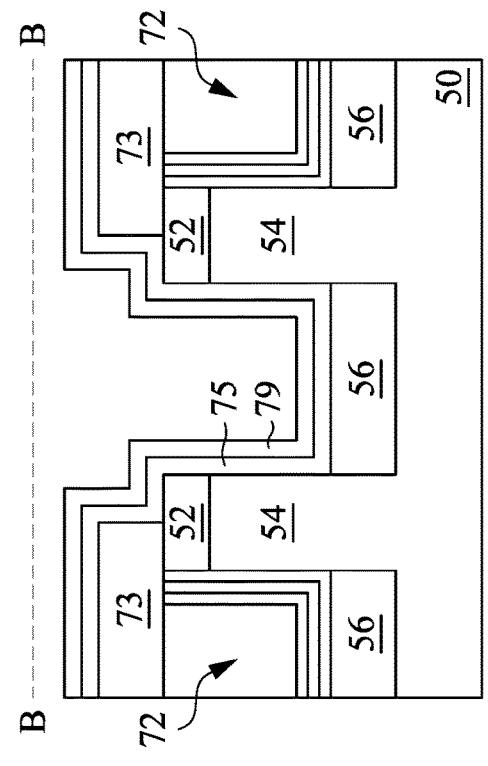

Referring now to FIGS. 11A-11C, a switching gate dielectric layer 75 and a switching gate layer 79 is illustrated in accordance with some embodiments. The switching gate dielectric layer 75 comprises one or more dielectric materials, such as a high-k dielectric material, deposited over the surface after the patterned dielectric layer 73. The high-k dielectric material may include a metal oxide or a silicate of Hf, Al, Zr, La, Mg, Ba, Ti, Pb, and combinations thereof. The switching gate dielectric layer 75 may be formed using any suitable deposition technique such as, CVD, RPCVD, molecular beam deposition (MBD), atomic layer deposition (ALD), or the like. In some embodiments, the switching gate dielectric layer 75 comprises $HfO_2$ of about 2 nm thick to about 5 nm thick. In an example embodiment, the switching gate dielectric layer 75 may be a 3 nm $HfO_2$ layer.

The switching gate layer 79 comprises one or more conductive materials deposited over the switching gate dielectric layer 75. In some embodiments, the conductive materials used to form the switching gate layer 79 may include a barrier metal layer (not separately shown) and a work function metal layer (not separately shown). The conductive materials may comprise metals such as TiN, TaN, TaC, Co, Ru, Al, combinations thereof, or multi-layers thereof. The switching gate layer 79 may be formed using CVD, PECVD, PVD, ALD, PEALD, ECP, an electroless plating technique, or the like.

As illustrated in FIGS. 11B and 11C, the switching gate dielectric layer 75 and the switching gate layer 79 are formed conformally along the top surface and the sidewalls of the patterned dielectric layer 73, the floors of the openings 64 (see FIGS. 10B and 10C), and along the exposed sidewalls of the fins 54 and the hard mask layer 52. In some embodiments, the switching gate layer 79 may fill the openings 64.

Figure 12C:
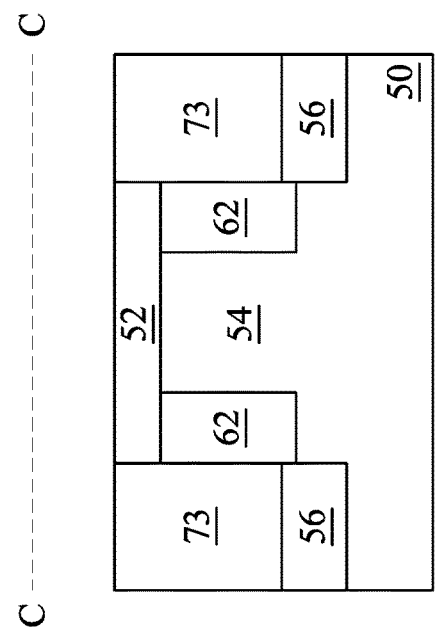
Figure 12A:
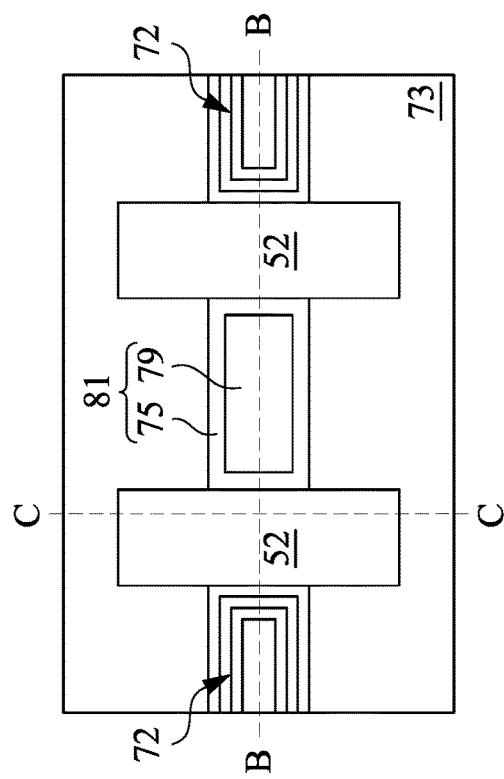
Figure 12B:
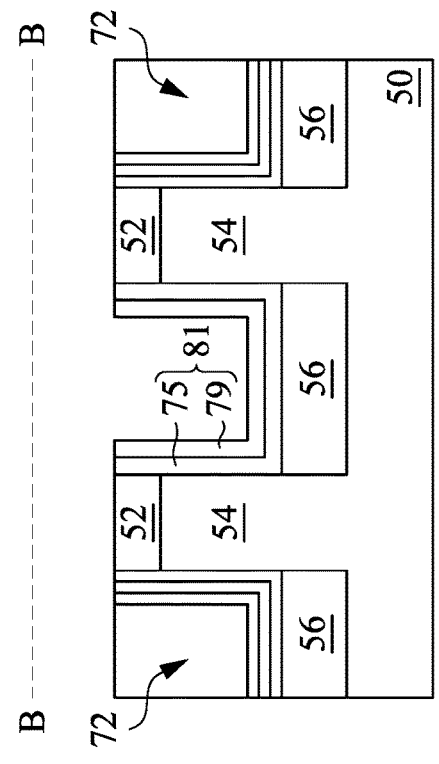

In FIGS. 12A-12C the switching gate dielectric layer 75 and the switching gate layer 79 are etched back using a planarization process (e.g., a CMP planarization process) to remove excess material above the hard mask layer 52 and along an upper surface of the patterned dielectric layer 73. The top surfaces of the hard mask layer 52, the patterned dielectric layer 73, and the programming gate structures 72 are formed substantially coplanar with each other within processing variations. In the example illustrated in FIGS. 12A-12C, the hard mask layer 52 is not completely removed by the CMP. In some embodiments, an overetch step may completely remove the hard mask layer 52, thereby exposing a top semiconductor surface of the fin 54.

As illustrated in FIGS. 12A and 12B, the planarization process confines the switching gate dielectric layer 75 and the switching gate layer 79 within cavities enclosed by one pair of adjacent sidewalls of the patterned dielectric layer 73 in one direction, a second pair of adjacent sidewalls of adjacent fins 54 in the perpendicular direction. The processes described above allows for the programming gate structures 72 and the switching gate structures 81 to be self-aligned to the sidewalls of the fins 54.

Each of the two upper portions of fins 54 illustrated in the cross-sectional view in FIG. 12B may be described as a dual-gate SAUG FinFET channel having the programming gate structure 72 on one sidewall and the switching gate structure 81 on the opposing sidewall.

Figure 13C:
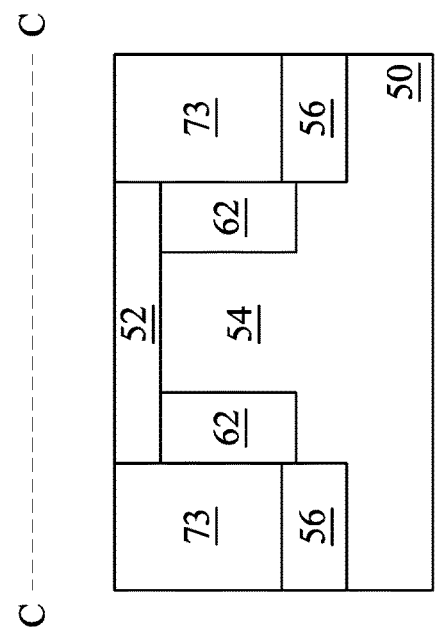
Figure 13A:
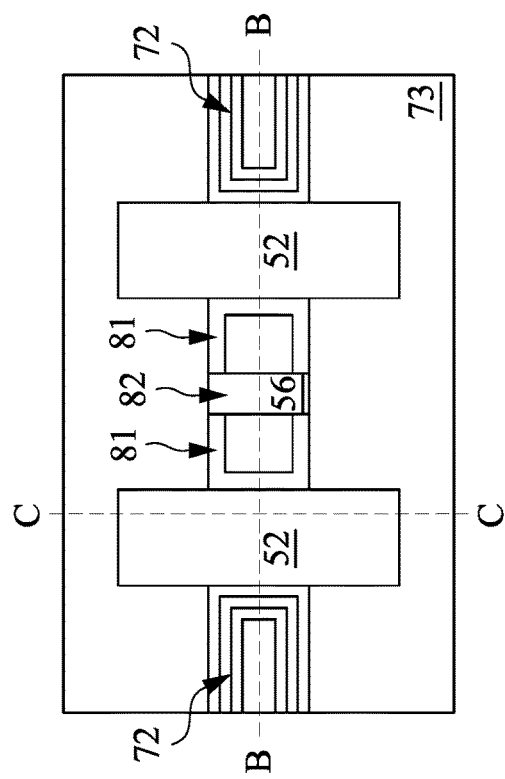
Figure 13B:
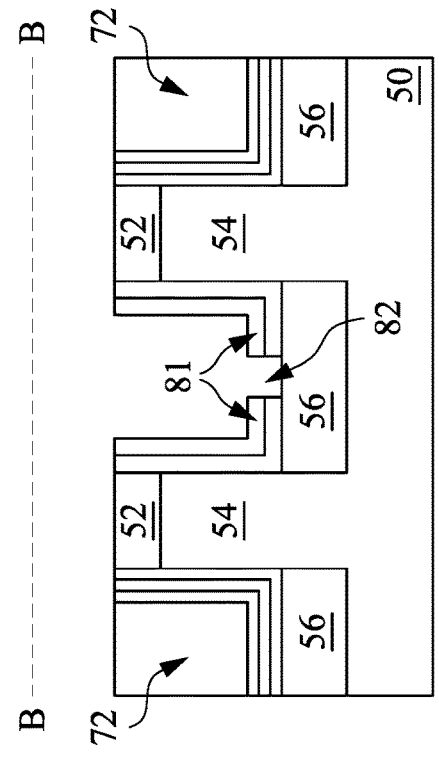

FIGS. 13A-13C illustrate an additional patterning step that may be used to remove a portion of the switching gate structure 81 formed over the isolation region 56 between the fins 54, in accordance with some embodiments. For example, a patterned masking layer (not shown), such as a patterned photoresist layer or a sacrificial patterned hard mask layer, may be used to etch exposed regions of the switching gate structure 81 using a suitable etching technique (e.g., RIE). The patterned mask may be removed (e.g., by ashing the photoresist using oxygen plasma) after the etching process is completed. In the example illustrated in FIGS. 13A-13C, a portion of the switching gate structure 81 is removed from over the isolation region 56 to form an opening 82, thereby physically and electrically disconnecting the switching gate structure 81 formed alongside sidewalls of one of the fins 54 from the switching gate structure 81 formed alongside sidewalls of the adjacent fin 54.

Figure 14C:
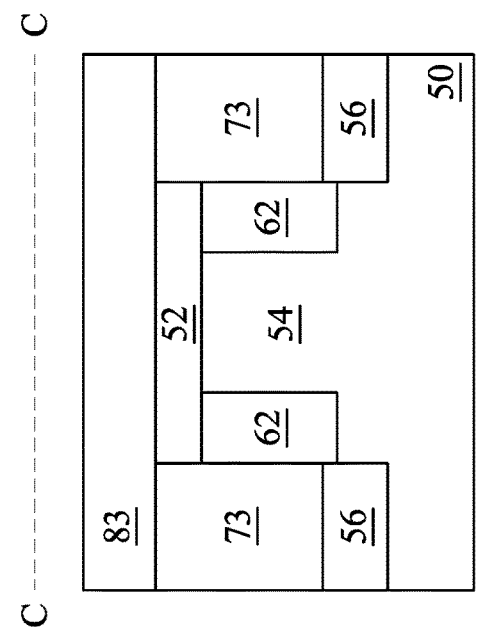
Figure 14A:
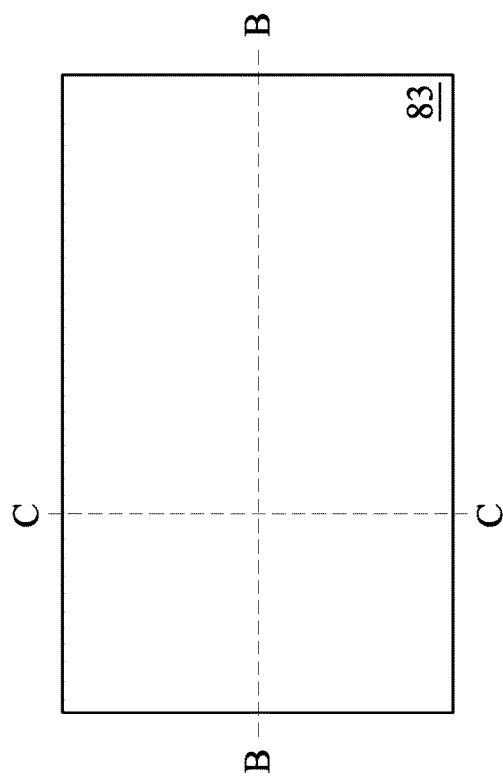
Figure 14B:
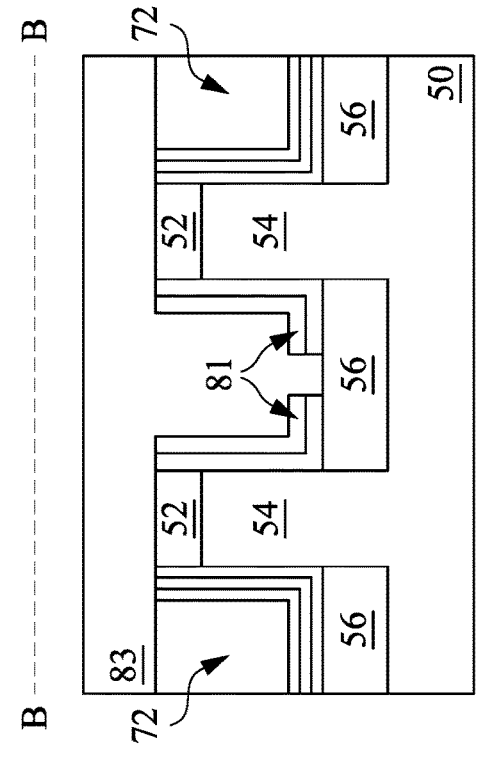

FIGS. 14A through 15C illustrate formation of an interlayer dielectric (ILD) layer 83 having contacts 87 extending through ILD layer 83 to electrodes of the two SAUG FinFETs illustrated in FIGS. 13A-13C. Referring first to FIGS. 14A-14C, an interlayer dielectric (ILD) layer 83, comprising one or more dielectric layers, is formed over the surface and fills the recesses in the switching gate structures 81, including the openings 82 (see FIGS. 13A and 13 B). In some embodiments, the insulating materials to form the ILD layer 83 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 83 may be deposited using any suitable method, such as CVD, PVD, PECVD, HDP-CVD, SACVD, FCVD, spin-on, and/or the like, or a combination thereof. In some embodiments, the ILD layer 83 may be planarized using a planarizing process (e.g., CMP).

Figure 15C:
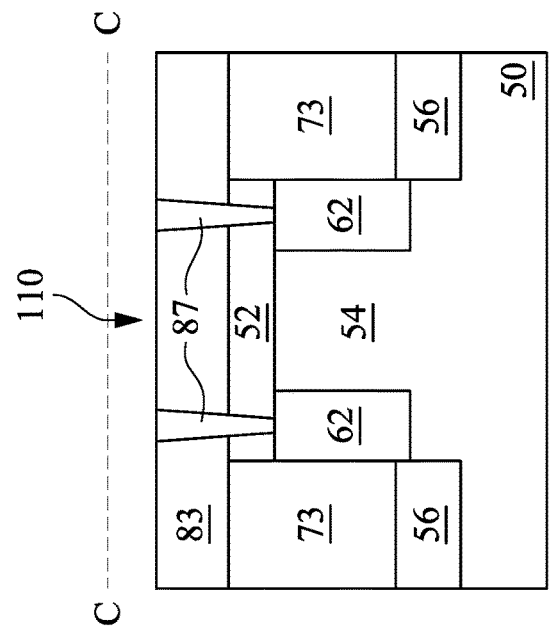
Figure 15A:
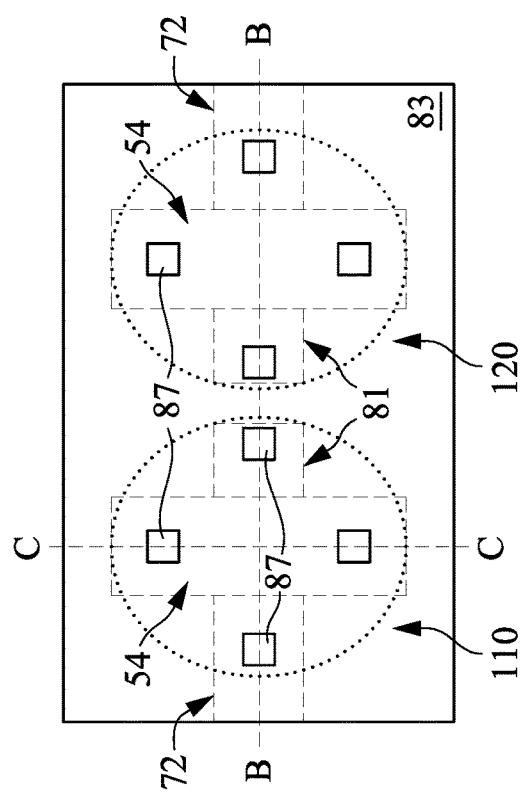
Figure 15B:
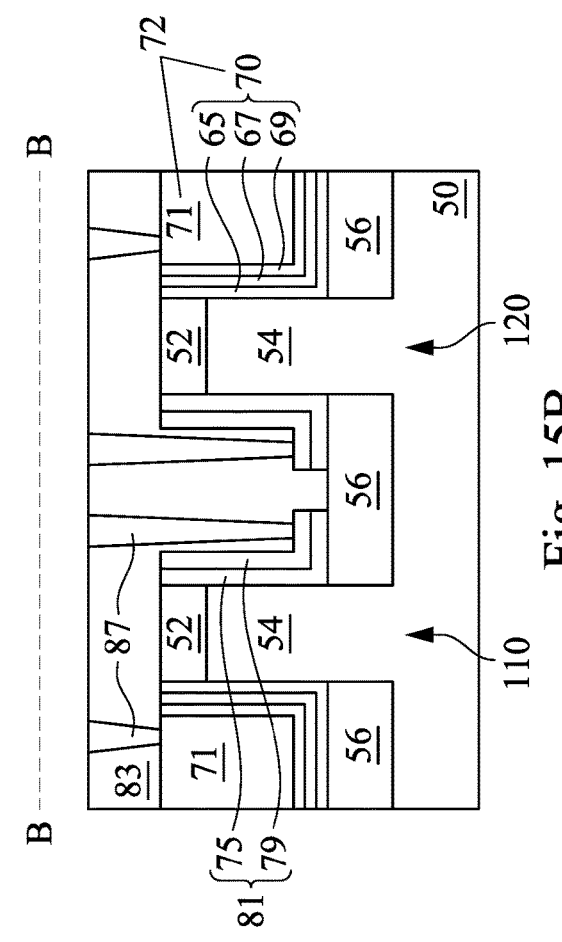

FIGS. 15A-15C illustrate the contacts 87 making electrical connections to the electrodes of two SAUG FinFETs 110 and 120. Four of the contacts 87 shown in FIG. 15A are along the axis B-B. The cross-sectional view along the longitudinal axis B-B, illustrated in FIG. 15B, show the four contacts, formed through the ILD layer 83, making connections to the control gate 71 and the switching gate layer 79 over the isolation regions 56. FIG. 15A also shows two different contacts 87 along the axis C-C. In FIG. 15C it is seen from the cross-sectional view along the longitudinal axis C-C that these two contacts are formed through the ILD layer 83 and the hard mask layer 52 to make electrical connections to the source/drain regions 62.

The contacts 87 may be formed using appropriate photolithography and etching techniques. For example, a patterned mask (e.g., a patterned photoresist mask or a patterned hard mask) may be formed over the ILD 83 and used to etch openings that extend through the ILD layer 83 to expose a portion of the control gate 71 and the switching gate layer 79 over isolation regions 56. The same patterning steps may be used to etch openings over the fins 54 that extend further, through the hard mask layer 52 below the ILD layer 83, to expose portions of the heavily-doped regions of the source/drain 62. In some embodiments, an anisotropic dry etch process may be used wherein the etching is performed in two successive steps. The etchants used in the first step of the etch process have a higher etch rate for the insulating materials of the ILD layer 83 relative to the etch rate for the materials used in the control gate 71, the switching gate layer 79 and the hard mask layer 52. Once the exposed portions of the ILD layer 83 are removed to expose portions of the respective layers below the ILD layer 83, a second step of the etch process may be performed wherein the etchants may be switched to selectively remove the exposed portions of the hard mask layer 52 to expose a portion of the source/drain regions 62 below the hard mask layer 52.

In some embodiments, a conductive liner (not separately shown) may be formed in the openings in the ILD layer 83. Subsequently, the openings are filled with a conductive fill material. The liner comprises barrier metals used to reduce out-diffusion of conductive materials from the contacts 87 into the surrounding dielectric materials, such as the ILD layer 83. In some embodiments, the liner may comprise two barrier metal layers. The first barrier metal may come in contact with heavily-doped semiconductor materials in the source/drain regions 62 and, in some embodiments, in the control gates 71 which may comprise heavily-doped polycrystalline semiconductor material. The first barrier metal may be subsequently chemically reacted with the semiconductor materials it is in contact with to form a metallic silicide that forms a low-resistance ohmic metal-semiconductor interface. For example, if the heavily-doped semiconductor in the source/drain regions 62 and the control gates 71 is silicon, then the first barrier metal may comprise Ti, Ni, Pt, Co, other suitable metals, or their alloys. The second barrier metal layer of the conductive liner may additionally include other metals (e.g., TiN, TaN, Ta, Co, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 83. The resulting conductive plugs constitute the contacts 87 making physical and electrical connections to the electrodes of electronic devices, such as the SAUG FinFETs 110 and 120 illustrated in FIGS. 15A-15C. In this example, all the contacts are formed simultaneously using the same processing steps. However, it is understood that, in other embodiments contacts with different aspect ratios and/or connecting to electrodes using different conductive materials may be formed separately. In some embodiments the ILD layer 83 may be multi-layered and/or may have one or more etch stop layers inserted within the ILD layer 83.

Embodiments such as those discussed above illustrate a particular order, such as forming the programming gate structure 72 prior to forming the switching gate structure 81 for illustrative purposes. However, in some embodiments, the switching gate structure 81 may be formed prior to forming the programming gate structure 72.

In some embodiments, SAUG FinFETs such as those described in this disclosure are programmable $V_T$ devices where the $V_T$ can be set electrically. As described above with reference to FIG. 1, the charge trapped in the charge trapping dielectric 67 determines the $V_T$. The polarity and amount of the net charge in the charge trapping dielectric 67 can be controlled by biasing the control gate 71. For example, for an NMOS SAUG FinFET, a large net negative charge may be trapped in the charge trapping dielectric 67 by biasing the control gate 71 to a large positive potential (e.g., +10 V) with respect to the source terminal and a large net positive charge may be trapped in the charge trapping dielectric 67 by biasing the control gate 71 to a large negative potential (e.g., −10 V) with respect to the source terminal. A high $V_T$ may be programmed by trapping negative charge in the charge trapping dielectric 67 of an NMOS SAUG FinFET whereas, positive trapped charge may program the device to have a low $V_T$. For a PMOS SAUG FinFET, a high $V_T$ may be programmed by trapping positive charge in the charge trapping dielectric 67, whereas, negative trapped charge may program the device to have a low $V_T$.

The programmed state may be read by sensing the drain-to-source current ($I_{DS}$) flowing through the NMOS SAUG FinFET, when the switching gate layer 79 is turned on with the drain electrode biased. For example, the gate-to-source voltage ($V_{GS}$) may be biased 0.5 V (−0.5 V for PMOS) and the drain-to-source voltage ($V_{DS}$) may be biased 1.0 V (−1.0 V for PMOS). If the magnitude of the resulting $I_{DS}$ exceeds a detection threshold, it indicates that the device has been set to a low-$V_T$ charged state. This state of the device may be designated as logic '1'. Conversely, a low drain-to-source current ($I_{DS}$) in response to the same bias voltages (e.g., $V_{GS}$=0.5 V and $V_{DS}$=1.0 V), indicates that the device has been set to a high-$V_T$ charged state. This state of the device may be designated as logic '0'. The SAUG FinFET described in this disclosure may be designed such that the leakage of trapped charge is sufficiently low, such that the charged states (logic '1' and logic '0') of the SAUG FinFET are metastable, as described above with reference to FIG. 1, thereby allowing the SAUG FinFET to be used as a memory storage element of a NVM array. An example of a set of bias conditions for programming and sensing the binary data stored and the corresponding $I_{DS}$ for an example NMOS and an example PMOS SAUG FinFET are shown in the following tables. The example SAUG FinFETs have programming gate structures described in this disclosure with reference to FIGS. 7A-7C, and switching gate structures described with reference to FIGS. 11A-11C.

than two metastable charged states, programmed using more than two respective bias conditions on the control gate. For example, in an embodiment where four bias values (e.g., +10 V, +5 V, −5 V, and −10 V) may be used to program the SAUG FinFET to one of four metastable charged states, thereby storing two bits (e.g., '00', '01', '10', and '11') instead of storing binary information (e.g., '0' and '1').

In an embodiment, a method of forming a semiconductor structure includes: forming a fin extending from a substrate, the fin having isolation regions along opposing sides of the fin; forming a source region and a drain region in the fin; forming a programming gate structure on a first sidewall of the fin; and forming a switching gate structure on a second sidewall of the fin opposite the programming gate structure, wherein the programming gate structure and the switching gate structure are along a portion of the fin interposed between the source region and the drain region. In an embodiment, the method includes the programming gate structure that includes a SONOS structure which includes a first semiconductor material, a first oxide material, a nitride material, a second oxide material, and a second semiconductor material. The programming gate structure includes the first semiconductor material that includes the portion of the fin. Forming the programming gate structure which includes: depositing the first oxide material along a first sidewall of the fin; depositing the nitride material over the first oxide material; depositing the second oxide material over the nitride material; depositing the second semiconductor material over the second oxide material; and planarizing the first oxide material, the nitride material, the second oxide material, and the second semiconductor material, the planarizing removing the first oxide material, the nitride material, the second oxide material, and the second semiconductor material from over the fin. Forming the programming gate structure further includes: prior to depositing the first oxide material, depositing a sacrificial layer along the second sidewall of the fin. Depositing the sacrificial layer is

| NMOS SAUG FinFET | Control-gate Potential | Switching-gate Potential | Drain Potential | Source Potential | Substrate Potential | Drain-to-Source Current |
|---|---|---|---|---|---|---|
| Write '0' | positive | open | positive | ground | ground | |
| Write '1' | negative | open | ground | ground | ground | |
| Sense '0' | open | positive | positive | ground | ground | small |
| Sense '1' | open | positive | positive | ground | ground | large |

| PMOS SAUG FinFET | Control-gate Potential | Switching-gate Potential | Drain Potential | Source Potential | Substrate Potential | Drain-to-Source Current |
|---|---|---|---|---|---|---|
| Write '0' | negative | open | ground | ground | ground | |
| Write '1' | positive | open | ground | ground | ground | |
| Sense '0' | open | negative | ground | positive | positive | small |
| Sense '1' | open | negative | ground | positive | positive | large |

In accordance with these tables, the example SAUG FinFET may be programmed into one of two metastable charged states by biasing the control gate. A large bias of one polarity (e.g. +10 V for NMOS and −10 V for PMOS) on the control gate programs the SAUG FinFET to a metastable charged state corresponding to a logic state '0' and a large bias of the opposite polarity (e.g. −10 V for NMOS and +10 V for PMOS), programs the SAUG FinFET to a metastable charged state corresponding to a logic state '1'. In some embodiments, the SAUG FinFET may be designed for more included in the method of forming the switching gate structure that includes: removing the sacrificial layer; forming a gate dielectric layer on the second sidewall of the fin; forming a gate electrode layer over the gate dielectric layer; and planarizing the gate dielectric layer and the gate electrode layer to remove portions of the gate dielectric layer and the gate electrode layer from over the fin. Forming the switching gate structure includes the gate electrode layer having a non-planar upper surface after planarizing the gate electrode layer.

In an embodiment, a method of forming a semiconductor structure includes: forming a fin extending from a substrate, the fin having isolation regions along opposing sides of the fin; forming a first dielectric layer over the fin, the first dielectric layer having a first opening, the first opening exposing a first sidewall of the fin and extending above the fin; forming a first oxide layer in the first opening; forming a nitride layer over the first oxide layer; forming a second oxide layer over the nitride layer; forming a semiconductor layer over the second oxide layer; planarizing the first oxide layer, the nitride layer, the second oxide layer, and the semiconductor layer to remove the first oxide layer, the nitride layer, the second oxide layer, and the semiconductor layer from over the fin, wherein remaining portions of the first oxide layer, the nitride layer, the second oxide layer, and the semiconductor layer form a programming gate structure; removing the first dielectric layer; forming a second dielectric layer over the fin, the second dielectric layer having a second opening, the second opening exposing a second sidewall of the fin opposite the programming gate structure and extending above the fin; forming a gate dielectric layer in the second opening; forming a gate electrode layer over the gate dielectric layer; and planarizing the gate dielectric layer and the gate electrode layer to remove the gate dielectric layer and the gate electrode layer from over the fin, wherein remaining portions of the gate dielectric layer and the gate electrode layer form a switching gate structure. In an embodiment, the method includes forming the semiconductor layer includes completely filling the first opening. In an embodiment, the method further includes: etching an opening in the gate electrode layer to form a first gate electrode and a second gate electrode, the first gate electrode being a portion of the switching gate structure, the second gate electrode being a portion of another switching gate structure; and forming an interlayer dielectric layer over the switching gate structure and the another switching gate structure, where the interlayer dielectric layer is interposed between a first end of the first gate electrode and a second end of the second gate electrode. In an embodiment, the method includes the gate electrode layer not completely filling the second opening prior to planarizing the gate dielectric layer and the gate electrode layer. In an embodiment, the method further includes forming doped source/drain regions prior to forming the first dielectric layer. Forming the source/drain regions includes: depositing sacrificial doping layer, the sacrificial doping layer includes n-type or p-type dopants; and annealing to drive the n-type or p-type dopants into the fin. The use of the sacrificial doping layer further includes removing the sacrificial doping layer. In an embodiment, the method includes forming the fin, forming the fin includes the fin having a hard mask layer on the fin, where the programming gate structure and the switching gate structure extends along sidewalls of the hard mask layer.

In an embodiment, a semiconductor device includes: a semiconductor fin; a first gate structure on a first side of the semiconductor fin, the first gate structure includes: a first oxide layer on a first sidewall of the semiconductor fin; a nitride layer on the first oxide layer; a second oxide layer on the nitride layer; and a semiconductor layer on the second oxide layer; and second gate structure on a second side of the semiconductor fin opposite the first gate structure, the second gate structure includes: a gate dielectric layer on a second sidewall of the semiconductor fin; and a gate electrode on the gate dielectric layer. In an embodiment, the semiconductor device further includes a dielectric layer on the semiconductor fin, including an upper surface of the dielectric layer that is level with an uppermost surface of the nitride layer. The upper surface of the dielectric layer on the semiconductor fin is level with an uppermost surface of the gate electrode. In an embodiment, the device includes an upper surface of the semiconductor layer that is level. In an embodiment, the device includes the gate electrode that is a conformal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a fin extending from a substrate, the fin having isolation regions along opposing sides of the fin;
    forming a source region and a drain region in the fin;
    forming a programming gate structure on a first sidewall of the fin;
    forming a switching gate structure on a second sidewall of the fin opposite the programming gate structure, wherein the programming gate structure and the switching gate structure are along a portion of the fin interposed between the source region and the drain region;
    forming a first contact to the programming gate structure, wherein the first contact contacts the programming gate structure at a point not lower than an upper surface of the fin; and
    forming a second contact to the switching gate structure, wherein the second contact contacts the switching gate structure at a point lower than the upper surface of the fin.

2. The method of claim 1, wherein the programming gate structure includes a SONOS structure comprising a first semiconductor material, a first oxide material, a nitride material, a second oxide material, and a second semiconductor material.

3. The method of claim 2, wherein the first semiconductor material includes the portion of the fin.

4. The method of claim 2, wherein forming the programming gate structure includes:
    depositing the first oxide material along first sidewall of the fin;
    depositing the nitride material over the first oxide material;
    depositing the second oxide material over the nitride material;
    depositing the second semiconductor material over the second oxide material; and
    planarizing the first oxide material, the nitride material, the second oxide material, and the second semiconductor material, the planarizing removing portion of the first oxide material, the nitride material, the second oxide material, and the second semiconductor material from over the fin.

5. The method of claim 4, further comprising:
prior to depositing the first oxide material, depositing a sacrificial layer along the second sidewall of the fin.

6. The method of claim 5, wherein forming the switching gate structure includes:
removing the sacrificial layer;
forming a gate dielectric layer on the second sidewall of the fin;
forming a gate electrode layer over the gate dielectric layer; and
planarizing the gate dielectric layer and the gate electrode layer to remove portions of the gate dielectric layer and the gate electrode layer from over the fin.

7. The method of claim 6, wherein the gate electrode layer has a non-planar upper surface after planarizing the gate electrode layer.

8. A method of forming a semiconductor structure, the method comprising:
forming a fin extending from a substrate, the fin having isolation regions along opposing sides of the fin;
forming a first dielectric layer over the fin, the first dielectric layer having a first opening, the first opening exposing a first sidewall of the fin and extending above the fin;
forming a first oxide layer in the first opening;
forming a nitride layer over the first oxide layer;
forming a second oxide layer over the nitride layer;
forming a semiconductor layer over the second oxide layer;
planarizing the first oxide layer, the nitride layer, the second oxide layer, and the semiconductor layer to remove portions of the first oxide layer, the nitride layer, the second oxide layer, and the semiconductor layer from over the fin, wherein remaining portions of the first oxide layer, the nitride layer, the second oxide layer, and the semiconductor layer form a programming gate structure;
removing the first dielectric layer;
forming a second dielectric layer over the fin, the second dielectric layer having a second opening, the second opening exposing a second sidewall of the fin opposite the programming gate structure and extending above the fin;
forming a gate dielectric layer in the second opening;
forming a gate electrode layer over the gate dielectric layer; and
planarizing the gate dielectric layer and the gate electrode layer to remove portions of the gate dielectric layer and the gate electrode layer from over the fin, wherein remaining portions of the gate dielectric layer and the gate electrode layer form a switching gate structure.

9. The method of claim 8, wherein forming the semiconductor layer includes completely filling the first opening.

10. The method of claim 8, further comprising:
etching an opening in the gate electrode layer to form a first gate electrode and a second gate electrode, the first gate electrode being a portion of the switching gate structure, the second gate electrode being a portion of another switching gate structure; and
forming an interlayer dielectric layer over the switching gate structure and the another switching gate structure, wherein the interlayer dielectric layer is interposed between a first end of the first gate electrode and a second end of the second gate electrode.

11. The method of claim 8, wherein the gate electrode layer does not completely fill the second opening prior to planarizing the gate dielectric layer and the gate electrode layer.

12. The method of claim 8, further comprising forming doped source/drain regions prior to forming the first dielectric layer.

13. The method of claim 12, wherein forming source/drain regions includes:
depositing a sacrificial doping layer, the sacrificial doping layer comprising n-type or p-type dopants; and
annealing to drive the n-type or p-type dopants into the fin.

14. The method of claim 13, further comprising removing the sacrificial doping layer.

15. The method of claim 8, wherein forming the fin includes forming the fin having a hard mask layer on the fin, wherein the programming gate structure and the switching gate structure extends along sidewalls of the hard mask layer.

16. A semiconductor device comprising:
a semiconductor fin;
a first gate structure on a first side of the semiconductor fin, the first gate structure comprising:
a first oxide layer on a first sidewall of the semiconductor fin;
a nitride layer on the first oxide layer;
a second oxide layer on the nitride layer; and
a semiconductor layer on the second oxide layer, wherein the semiconductor layer has a planar upper surface level; and
a second gate structure on a second side of the semiconductor fin opposite the first gate structure, the second gate structure comprising:
a gate dielectric layer on a second sidewall of the semiconductor fin; and
a gate electrode on the gate dielectric layer, wherein the gate electrode has a non-planar upper surface.

17. The semiconductor device of claim 16, further comprising a dielectric layer on the semiconductor fin, wherein an upper surface of the dielectric layer is level with an uppermost surface of the nitride layer.

18. The semiconductor device of claim 17, wherein the upper surface of the dielectric layer is level with an uppermost surface of the gate electrode.

19. The semiconductor device of claim 16, wherein an upper surface of the semiconductor layer is level with an uppermost surface of the gate electrode.

20. The semiconductor device of claim 16, wherein an entirety of an upper surface of the gate electrode is not level with an upper surface of the semiconductor layer.

* * * * *